United States Patent
Nabavi et al.

(10) Patent No.: US 12,418,251 B2
(45) Date of Patent: Sep. 16, 2025

(54) ROTATIONAL AND TRANSLATIONAL MICROPOSITIONERS USING DEFORMABLE MICROELECTROMECHANICAL SYSTEMS

(71) Applicants: Seyedfakhreddin Nabavi, Montreal (CA); Michael Menard, Verdun (CA); Frederic Nabki, Montreal (CA)

(72) Inventors: Seyedfakhreddin Nabavi, Montreal (CA); Michael Menard, Verdun (CA); Frederic Nabki, Montreal (CA)

( * ) Notice: Subject to any disclaimer, the term of this patent is extended or adjusted under 35 U.S.C. 154(b) by 0 days.

(21) Appl. No.: 17/815,408

(22) Filed: Jul. 27, 2022

(65) Prior Publication Data
US 2023/0042123 A1     Feb. 9, 2023

Related U.S. Application Data

(60) Provisional application No. 63/203,647, filed on Jul. 27, 2021.

(51) Int. Cl.
*H02N 1/00*      (2006.01)
*G02B 6/35*      (2006.01)

(52) U.S. Cl.
CPC .......... *H02N 1/006* (2013.01); *G02B 6/3584* (2013.01)

(58) Field of Classification Search
CPC .............................. H02N 1/006; G02B 6/3584
See application file for complete search history.

(56) References Cited

U.S. PATENT DOCUMENTS

| | | | | |
|---|---|---|---|---|
| 7,180,650 B2 * | 2/2007 | Epitaux | ................ | B81B 3/0062 359/290 |
| 2001/0051014 A1 * | 12/2001 | Behin | .................... | H02N 1/008 385/16 |

* cited by examiner

*Primary Examiner* — Sung H Pak
(74) *Attorney, Agent, or Firm* — Rosenberg, Klein & Lee

(57) ABSTRACT

Microelectromechanical systems (MEMS) have found widespread applications across biotechnology, medicine, communications, and consumer electronics. These are typically one-dimensional MEMS (e.g. rotation, linear translation on a single axis) or two-dimensional MEMS (e.g. linear translation in two directions in the plane of the MEMS). It would be beneficial therefore for designers of components, circuits, and systems to exploit MEMS elements that produce both out-of-plane and in-plane motion thereby allowing for novel two-dimensional and three-dimensional MEMS micropositioners.

13 Claims, 14 Drawing Sheets

Displacement (μm)

ROTATIONAL AND TRANSLATIONAL MICROPOSITIONERS USING DEFORMABLE MICROELECTROMECHANICAL SYSTEMS

CROSS-REFERENCE TO RELATED APPLICATIONS

This application claims the benefit of priority from U.S. Provisional Patent Application 63/203,647 filed Jul. 27, 2021, the entire contents of which are incorporated herein by reference.

FIELD OF THE INVENTION

This invention relates to microelectromechanical systems (MEMS) and more particular to MEMS structures, systems, and methods for providing both out-of-plane and in-plane motion including translational and rotational displacements.

BACKGROUND OF THE INVENTION

Micro-Electro-Mechanical Systems, or MEMS, is a technology that in its most general form can be defined as miniaturized mechanical and electro-mechanical elements (i.e., devices and structures) that are made using the techniques of microfabrication. The critical physical dimensions of MEMS devices can vary from well below one micron to several millimeters.

MEMS have found widespread applications across biotechnology, medicine, communications, and consumer electronics. In most applications the MEMS is either self-contained or designed to interface with an external environment such as a fluid etc. However, they have also found application in optoelectronics to provide movable platforms to provide optical functionality, such as switching or attenuation for example, or provide manipulation of a component with respect to another to align them thereby allowing reduced manufacturing tolerances of the components themselves or their assembly techniques to be accommodated.

However, within the prior art MEMS actuators are typically one-dimensional (e.g. rotation, linear translation on a single axis) or two-dimensional (e.g. linear translation in two directions in the plane of the MEMS). Accordingly, it would be beneficial to provide designers of components, circuits, and systems exploiting MEMS elements with micromechanical structures for producing both out-of-plane and in-plane motion.

Accordingly, the inventors have established a number of inventive MEMS micropositioners (actuators) to provide discrete motion out-of-plane as well as three-dimensional MEMS micropositioners (actuators). The novel MEMS actuators being compatible with standard commercial MEMS and/or micromachining processes allowing integration of the novel MEMS actuators with existing MEMS fabrication process flows etc.

Other aspects and features of the present invention will become apparent to those ordinarily skilled in the art upon review of the following description of specific embodiments of the invention in conjunction with the accompanying figures.

SUMMARY OF THE INVENTION

It is an object of the present invention to mitigate limitations in the prior art relating to microelectromechanical systems (MEMS) and more particular to MEMS structures, systems, and methods for providing both out-of-plane and in-plane motion including translational and rotational displacements.

In accordance with an embodiment of the invention there is provided a microelectromechanical systems (MEMS) device comprising:
- a comb drive comprising a first portion and a second portion, the first portion and second portion providing a set of interdigitated fingers;
- an anchor beam coupled to the first portion of the comb drive having an end anchored to a substrate upon which the MEMS device is formed on one side of the first portion of the comb drive and a another distal end anchored to the substrate on another side of the first portion of the comb drive opposite the one side;
- a support beam coupled at one end to the second portion of the comb drive and at another distal end coupled to a moveable plate; and
- the moveable plate suspended from the substrate.

In accordance with an embodiment of the invention there is provided a microelectromechanical systems (MEMS) device comprising:
- a comb drive comprising a first portion and a second portion, the first portion and second portion providing a set of interdigitated fingers;
- an anchor beam coupled to the first portion of the comb drive having an end anchored to a substrate upon which the MEMS device is formed on one side of the first portion of the comb drive and another distal end anchored to the substrate on another side of the first portion of the comb drive opposite the one side;
- a support beam coupled at one end to the second portion of the comb drive and at another distal end coupled to a moveable plate;
- the moveable plate suspended from the substrate;
- another comb drive comprising another first portion and another second portion, the first portion and second portion providing a set of interdigitated fingers;
- another anchor beam coupled to the first portion of the another comb drive having an end anchored to the substrate is formed on one side of the first portion of the another comb drive and another distal end anchored to the substrate on another side of the first portion of the another comb drive opposite the one side;
- another support beam coupled at one end to the second portion of the another comb drive and at another distal end coupled to the moveable plate.

In accordance with an embodiment of the invention there is provided a microelectromechanical systems (MEMS) device comprising:
- a comb drive comprising a first portion and a second portion, the first portion and second portion providing a set of interdigitated fingers;
- an anchor coupled to the first portion of the comb drive anchored to a substrate upon which the MEMS device is formed;
- a support beam coupled at one end to the second portion of the comb drive and at another distal end coupled to a moveable plate;
- the moveable plate suspended from the substrate; and
- a fixed electrode disposed beneath the moveable plate coupled to the substrate.

In accordance with an embodiment of the invention there is provided a microelectromechanical systems (MEMS) device comprising:
- a comb drive comprising a first portion and a second portion, the first portion and second portion providing a set of interdigitated fingers;
- an anchor coupled to the first portion of the comb drive and anchored to a substrate upon which the MEMS device is formed;
- a support beam coupled at one end to the second portion of the comb drive and at another distal end coupled to a moveable plate;
- the moveable plate suspended from the substrate;
- another comb drive comprising a first portion and a second portion, the first portion and second portion providing a set of interdigitated fingers;
- another anchor coupled to the first portion of the another comb drive and anchored to the substrate;
- another support beam coupled at one end to the second portion of the another comb drive and at another distal end coupled to the moveable plate; and
- a fixed electrode disposed beneath the moveable plate coupled to the substrate.

In accordance with an embodiment of the invention there is provided a microelectromechanical systems (MEMS) device comprising:
- a beam having a predetermined width, a predetermined thickness and a predetermined elongate geometry suspended above a substrate upon which the MEMS is formed having a major axis and a minor axis;
- a side of the beam coupled to an anchor which is coupled to the substrate;
- another side of the beam distal to the side of the beam coupled to another anchor which is coupled to the substrate;
- a layer disposed between an end of the beam and another end of the beam distal to the end of the beam; wherein
- the end of the beam and the another end of the beam are disposed along the major axis; and
- the side of the beam and the another side of the beam are disposed along the minor axis.

In accordance with an embodiment of the invention there is provided a microelectromechanical systems (MEMS) device comprising:
- a plurality of first MEMS actuators connected in series along a first axis between a first anchor and an end of a support beam;
- a plurality of second MEMS actuators connected in series along the first axis between a second anchor and a distal end of the support beam;
- a plurality of third MEMS actuators connected in series along a second axis perpendicular to the first axis between a third anchor and an end of another support beam;
- the another support beam coupled at a second distal end to the support beam; wherein
- each first MEMS actuator of the plurality of first MEMS actuators comprises a layer disposed with a predetermined orientation with respect to the second axis which when actuated distorts the first MEMS actuator of the plurality of first MEMS actuators;
- each second MEMS actuator of the plurality of second MEMS actuators comprises another layer disposed with a predetermined orientation with respect to the second axis which when actuated distorts the second MEMS actuator of the plurality of second MEMS actuators;
- each third MEMS actuator of the plurality of third MEMS actuators comprises a further layer disposed with a predetermined orientation with respect to the first axis which when actuated distorts the third MEMS actuator of the plurality of third MEMS actuators; and
- actuation of at least of one of the plurality of first MEMS actuators, the plurality of second MEMS actuators and the plurality of third MEMS actuators results in translation of the support beam and another support beam relative to a substrate to which the first anchor, second anchor, and third anchor are attached.

In accordance with an embodiment of the invention there is provided a MEMS device comprising:
- a beam having a predetermined width, a predetermined thickness and a predetermined elongate geometry suspended above a substrate upon which the MEMS is formed having a major axis and a minor axis wherein a first end of the beam is attached to the substrate;
- a first electrostatic actuator proximate the first end of the beam comprising a first portion attached to the beam and a second portion attached to the substrate; and
- a second electrostatic actuator proximate the first end of the beam comprising a first portion attached to the beam and a second portion attached to the substrate; wherein
- the first electrostatic actuator and second electrostatic actuator are disposed either side of the beam along the major axis of the beam.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Figure 1A:
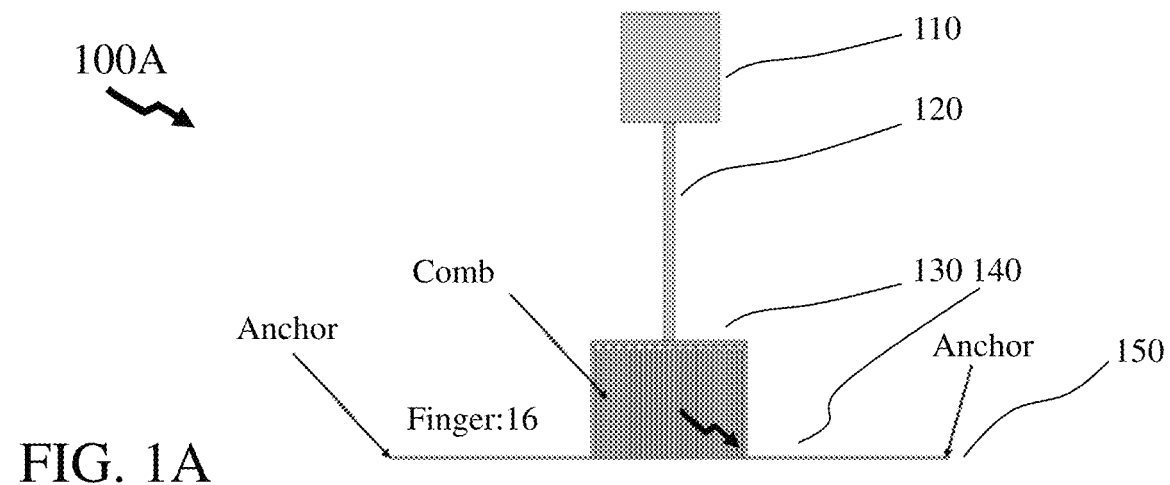
FIGS. 1A and 1B depict a structural diagram and optical micrograph of a rotational electrostatic microelectromechanical systems (MEMS) actuator according to an embodiment of the invention.

The present invention is directed to microelectromechanical systems (MEMS) and more particular to MEMS structures, systems, and methods for providing both out-of-plane and in-plane motion including translational and rotational displacements.

The ensuing description provides representative embodiment(s) only, and is not intended to limit the scope, applicability, or configuration of the disclosure. Rather, the ensuing description of the embodiment(s) will provide those skilled in the art with an enabling description for implementing an embodiment or embodiments of the invention. It being understood that various changes can be made in the function and arrangement of elements without departing from the spirit and scope as set forth in the appended claims. Accordingly, an embodiment is an example or implementation of the inventions and not the sole implementation. Various appearances of "one embodiment," "an embodiment" or "some embodiments" do not necessarily all refer to the same embodiments. Although various features of the invention may be described in the context of a single embodiment, the features may also be provided separately or in any suitable combination. Conversely, although the invention may be described herein in the context of separate embodiments for clarity, the invention can also be implemented in a single embodiment or any combination of embodiments.

Reference in the specification to "one embodiment", "an embodiment", "some embodiments" or "other embodiments" means that a particular feature, structure, or characteristic described in connection with the embodiments is included in at least one embodiment, but not necessarily all embodiments, of the inventions. The phraseology and terminology employed herein is not to be construed as limiting but is for descriptive purpose only. It is to be understood that where the claims or specification refer to "a" or "an" element, such reference is not to be construed as there being only one of that element. It is to be understood that where the specification states that a component feature, structure, or characteristic "may", "might", "can" or "could" be included, that particular component, feature, structure, or characteristic is not required to be included.

Reference to terms such as "left", "right", "top", "bottom", "front" and "back" are intended for use in respect to the orientation of the particular feature, structure, or element within the figures depicting embodiments of the invention. It would be evident that such directional terminology with respect to the actual use of a device has no specific meaning as the device can be employed in a multiplicity of orientations by the user or users.

Reference to terms "including", "comprising", "consisting" and grammatical variants thereof do not preclude the addition of one or more components, features, steps, integers, or groups thereof and that the terms are not to be construed as specifying components, features, steps, or integers. Likewise, the phrase "consisting essentially of", and grammatical variants thereof, when used herein is not to be construed as excluding additional components, steps, features integers or groups thereof but rather that the additional features, integers, steps, components, or groups thereof do not materially alter the basic and novel characteristics of the claimed composition, device, or method. If the specification or claims refer to "an additional" element, that does not preclude there being more than one of the additional element.

The ensuing description provides exemplary embodiment(s) only, and is not intended to limit the scope, applicability, or configuration of the disclosure. Rather, the ensuing description of the exemplary embodiment(s) will provide those skilled in the art with an enabling description for implementing an exemplary embodiment. It being understood that various changes may be made in the function and arrangement of elements without departing from the spirit and scope as set forth in the appended claims.

As previously noted, Micro-Electro-Mechanical Systems, or MEMS, is a technology that in its most general form can be defined as miniaturized mechanical and electro-mechanical elements (i.e., devices and structures) that are made using the techniques of microfabrication. The critical physical dimensions of MEMS devices can vary from well below one micron to several millimeters. Whilst finding widespread applications across biotechnology, medicine, communications, and consumer electronics. In optoelectronics MEMS have been exploited to provide movable platforms for integrated optical functionality, such as switching or attenuation for example. However, their exploitation in micro-positioning applications, such as optoelectronics, has been primarily through prototype. The exploitation of MEMS within optoelectronics would provide for the manipulation of a component (e.g. laser diode (LD), semiconductor optical amplifier (SOA), etc.) with respect to another component (e.g. optical switch, optical modulator, programmable wavelength division multiplexer, etc.) to align them thereby allowing reduced manufacturing tolerances of the components themselves or their assembly techniques to assemble them to be accommodated.

It would also be advantageous to be able to micro-position a movable platform either containing or supporting one or more optical waveguides in 3-axes (lateral, vertical and horizontal (forward and backwards relative to the initial as fabricated platform position) with respect to one or more other optical waveguides anchored upon a substrate. Optionally, the optical waveguide(s) upon the movable platform may terminate proximal a facet of the movable platform (i.e. an edge of the movable platform) or they may terminate prior to a facet of the movable platform and couple to other optical elements upon the movable platform such as optical micro-lenses, surface gratings, mirrors etc. which may be hybridly or monolithically integrated including those formed using direct write microfabrication techniques. It would be beneficial in some instances for the movable platform to be coupled at another facet to be attached to one or more flexible suspended optical waveguides, e.g. those formed using silicon nanowires, photonic wirebonds exploiting direct write microfabrication techniques, and silicon dioxide clad silicon nitride core waveguides released from the substrate to allow the motion of the movable platform to occur without significant stress being generated somewhere within the optical waveguide structure(s). By virtue of the 3 axis micro-positioning the optical waveguides upon the movable platform can be positioned vertically and laterally as well as the separation between the facets adjusted. Optionally, the suspended waveguides may be discrete or they may be formed upon a thin carrier layer such as a released MEMS device layer. An example of such an inventive structure being depicted and described below with respect to FIG. 27.

However, within the prior art MEMS actuators are typically one-dimensional (e.g. rotation, linear translation on a single axis) or two-dimensional (e.g. linear translation in two directions in the plane of the MEMS). Accordingly, it would be beneficial to provide designers of components, circuits, and systems exploiting MEMS elements with micromechanical structures for producing both out-of-plane and in-plane motion allowing three-dimensional MEMS actuators to be fabricated with extensions to four, five and six dimensional MEMS actuators.

Accordingly, the inventors have established a number of inventive MEMS micropositioners (actuators) to provide discrete translational and/or rotational motion out-of-plane as well as three-dimensional MEMS micropositioners (actuators). Combining novel MEMS actuators according to embodiments of the invention together with other novel MEMS actuators according to embodiments of the invention and/or prior MEMS actuators allowing extensions beyond three-dimensional MEMS actuators to four, five and six dimensional MEMS actuators. The novel MEMS actuators being compatible with standard commercial MEMS and/or micromachining processes allowing integration of the novel MEMS actuators with existing MEMS fabrication process flows etc.

Amongst the multiple technologies for optoelectronics silicon photonics offers a technology platform for reducing the cost structure of various optical components by leveraging the economies of scale of the microelectronics industry. In the same way as silicon CMOS circuits can be packaged using multiple die, then in principle so can silicon photonics devices. In order to optically interconnect a silicon photonics device to another device, various light energy transfer approaches have been developed based either on near field, far field or adiabatic coupling. Only near field edge coupling can provide for both low loss as well as for polarization diversity. However, to date, the packaging of photonic integrated circuits to support edge coupling has been restricted to active assembly and thus slow and very expensive as requiring light to perform the alignment. The passive packaging of silicon photonics devices has thus far been restricted to applications where higher optical losses can be tolerated. Even with the most innovative waveguide tapers, inverse tapers, and mode (spot) size converters to perform mode field conversion and mode field diameter matching, it has been impossible up to now to perform the passive packaging of telecommunications grade photonic integrated circuits.

Accordingly, silicon photonics allows for the integration of silicon MEMS directly within the same substrate. Beneficially, it also allows for the MEMS and potentially the silicon photonics to exploit silicon CMOS control and drive circuits. With respect to MEMS that may control and automate the alignment of elements within a silicon optical circuit either with respect to each other or with other optical elements hybrid integrated with the silicon optical circuit. In this manner, active alignment of input and output SOI waveguides to an InP optical gain chip (or other SOI circuit) may be provided which may be either maintained as active during deployment of the optical component comprising these elements or removed once the alignment has been "locked" through an attachment/retention/latching process.

Accordingly, novel MEMS actuators according to embodiments of the invention may provide for manipulation of and/or alignment to a variety of optical waveguides. For example, upon the silicon substrate optical waveguides may be formed exploiting a silicon nitride core with silicon oxide upper and lower cladding, a $SiO_2$—$Si_3N_4$—$SiO_2$ waveguide structure. However, it would be evident that other waveguide structures may be employed including, but not limited to, silica-on-silicon, with doped (e.g. germanium, Ge) silica core relative to undoped cladding, silicon oxynitride, polymer-on-silicon, doped silicon waveguides. Additionally, other waveguide structures may be employed including vertical and/or lateral waveguide tapers and forming microball lenses on the ends of the waveguides via laser and/or arc melting of the waveguide tip. Further, embodiments of the invention may provide for the optical alignment of a siliconon-insulator (SOI) waveguide, e.g. $SiO_2$—$Si_3N_4$—$SiO_2$; $SiO_2$—Ge: $SiO_2$—$SiO_2$; or Si—$SiO_2$, and an active InP waveguide, e.g. an SOA. LD etc. However, it would be evident to one skilled in the art that the embodiments of the invention may be employed in a variety of waveguide coupling structures coupling onto and/or from waveguides employing material systems that include, but not limited to, $SiO_2$—$Si_3N_4$—$SiO_2$; $SiO_2$—Ge: $SiO_2$—$SiO_2$; Si—$SiO_2$; ion exchanged glass, ion implanted glass, polymeric waveguides, InGaAsP, GaAs, III-V materials, II-VI materials, Si, SiGe, and optical fiber. Accordingly, MEMS actuators according to embodiments of the invention may be employed in waveguide-waveguide positioning as well as positioning active elements within one material system with passive elements in another material system, e.g. an SOA to a tunable waveguide filter for example, as well as the positioning of intermediate coupling optics, e.g. ball lenses, spherical lenses, graded refractive index (GRIN) lenses, etc. for free-space coupling into and/or from a waveguide.

Accordingly, within the following description a number of inventive MEMS micropositioners (actuators) to provide discrete translational and/or rotational motion out-of-plane as well as three-dimensional MEMS micropositioners (actuators) are described and depicted. Whilst the novel actuators presented exploit electrostatic or piezoelectric actuation or a combination of both, it would be evident that other actuation means may be employed without departing from the scope of the invention.

Within an electrostatic actuator, an electrical potential is applied to a MEMS, for example a comb-drive with a number of fingers on a pair of elements of the MEMS interspersed, wherein an electrostatic force is generated between the fingers on one element of the pair of elements and the fingers on the other element of the pair of elements thereby which, according to the direction of electrical potential, generates a push or pull motion with respect to the elements of the MEMS. Typically, one element is fixed to the substrate and the other is free so that the free element can thereby changes its position relative to the fixed element.

Within a piezoelectric actuator, a piezoelectric material, such as aluminum nitride (AlN), zinc oxide (ZnO) or lead zirconate titanate (PZT, $Pb[Zr Ti_{1-x}]O_3$) for example, is deposited onto one or more surfaces of a free element (i.e. moveable part) of a MEMS actuator. Application of a DC voltage to the piezoelectric material results in an expansion or contraction of the piezoelectric material deforming the free element of the MEMS actuator, either an in-plane or out-of-plane axis depending on the mechanical configuration of the free element of the MEMS actuator and the placement of the piezoelectric material. Other piezoelectric materials may include, but not be limited to, piezoelectric ceramics (piezoceramics), lead free piezoceramics, Group III-V semiconductors, Group II_VI semiconductors, and polymers such as polyvinylidene fluoride (PVDF) and its copolymers, polyamides, Parylene-C together with non-crystalline polymers such as polyimide and polyvinylidene chloride (PVDC).

Optionally, within other embodiments of the invention a piezoelectric element may be replaced by an element exploiting an alternative actuation means including, but not limited, electrostriction, thermal, and magnetostriction.

Within the following description six novel MEMS actuators according to embodiments of the invention are described and depicted. However, it would be evident that other actuators may exploit the techniques described and depicted. Four of the novel MEMS actuators presented are out-of-plane MEMS actuators exploiting solely electrostatic forces. The other two novel MEMS actuator configurations presented combine electrostatic and piezoelectric actuation to provide translational motion along three axes. Table 1 below summarize these novel MEMS actuators.

TABLE 1

Summary of Novel MEMS Actuators Presented

| Actuator | Description | Motion Axes | Comments |
|---|---|---|---|
| A | Out-of-Plane Rotation with In-Plane Comb Drives | Rotation in Vertical Direction (Z) | Compatible with silicon-on-insulator (SOI) fabrication processes |
| B | Out-of-Plane Translation with In-Plane Comb Drives | Translation in Vertical Direction (Z) | Compatible with silicon-on-insulator (SOI) fabrication processes |
| C | Out-of-Plane translation with Dual Layer Comb Drives | Rotation in Vertical Direction (Z) | Self-sensing capability |
| D | Out-of-Plane translation with Dual Layer Comb Drives | Translation in Vertical Direction (Z) | Self-sensing capability |
| E | Elliptical Actuators | X, Y and Z | Low cross sensitivities, can support optical waveguides |
| F | Comb and Piezoelectric MEMS Actuator | X, Y and Z | Compact and simple structure with eased fabrication and can support optical waveguides |

1: Out-of-Plane Electrostatic Actuator

Figure 1B:
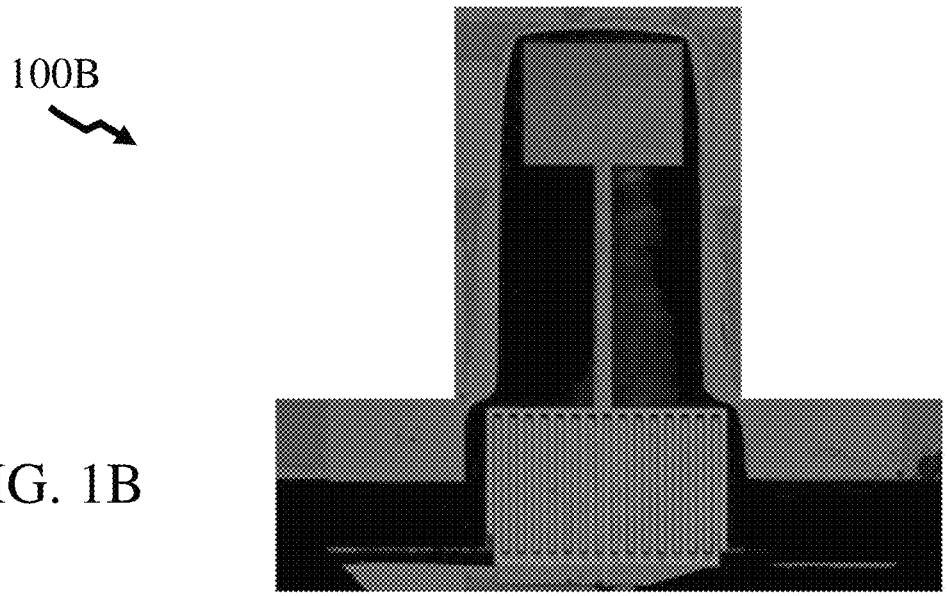

A structural diagram of a novel MEMS actuator according to an embodiment of the invention for out-of-plane rotational motion is shown in FIG. 1A with an optical micrograph of the fabricated MEMS actuator in FIG. 1B. As depicted in FIG. 1A the MEMS actuator structure is fixed at two distinct locations, Anchors 150 at either end of the Anchor Beam 140. The Moveable Plate 110 is attached to the Comb Drive 130 through a Supporting Beam 120. The electrostatic force, which pulls the comb fingers downward, causes a large out-of-plane (vertical) motion of the moveable plate, thanks to the low torsional stiffness of the structure in that direction. In contrast to prior art MEMS actuators to achieve out-of-plane motion with electrostatic MEMS actuators both sections of the Comb Drive 130, namely the portion attached to the Anchor Beam 140 and the other portion attached to the Supporting Beam 120 are fabricated in the same plane. This reduces the fabrication process complexity significantly. FIG. 1B depicts a fabricated MEMS actuator according to the design of FIG. 1A formed with a SOIMUMPs technology, such as that offered by MEMSCAP Inc.

Figure 2:
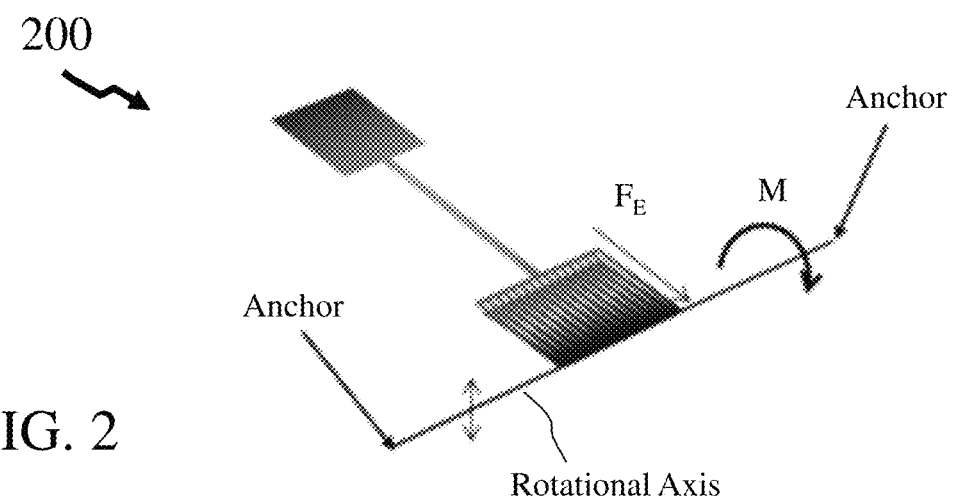
FIG. 2 depicts the simulated first mode shape of the rotational electrostatic MEMS actuator according to the embodiment of the invention in FIG. 1A.

Referring to FIG. 2 the mechanical mode shape of the rotational actuator is depicted. One can see that where the electrostatic force pushes the portion of the Comb Drive 130 attached to the Anchor Beam 140 away from the Moveable Plate 110 then an anticlockwise momentum results which rotates the structure around its rotational axis. Conversely, reversal of the electrostatic force pulling the portion of the Comb Drive 130 attached to the Anchor Beam 140 towards the Moveable Plate 110 results in a clockwise momentum which rotates the structure around its rotational axis in the reverse direction.

Figure 3:
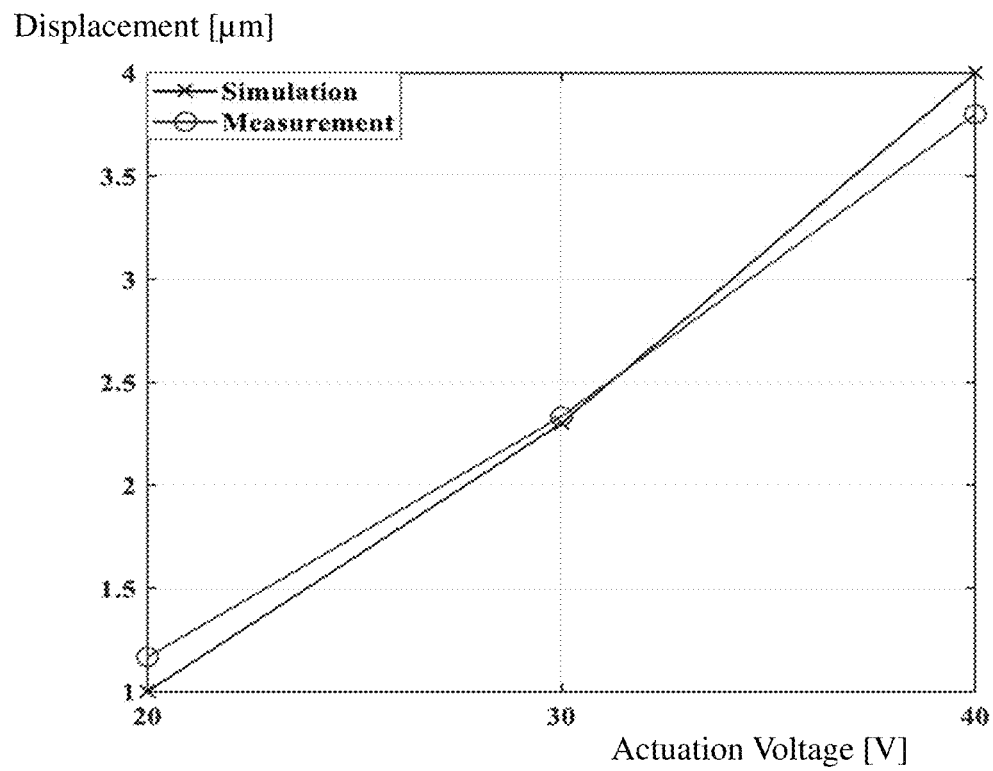
FIGS. 3 and 4 depict the generated rotational motion and angular displacement for different actuation voltages for the fabricated rotational electrostatic MEMS actuator according to the embodiment of the invention in FIG. 1A.
Figure 4:
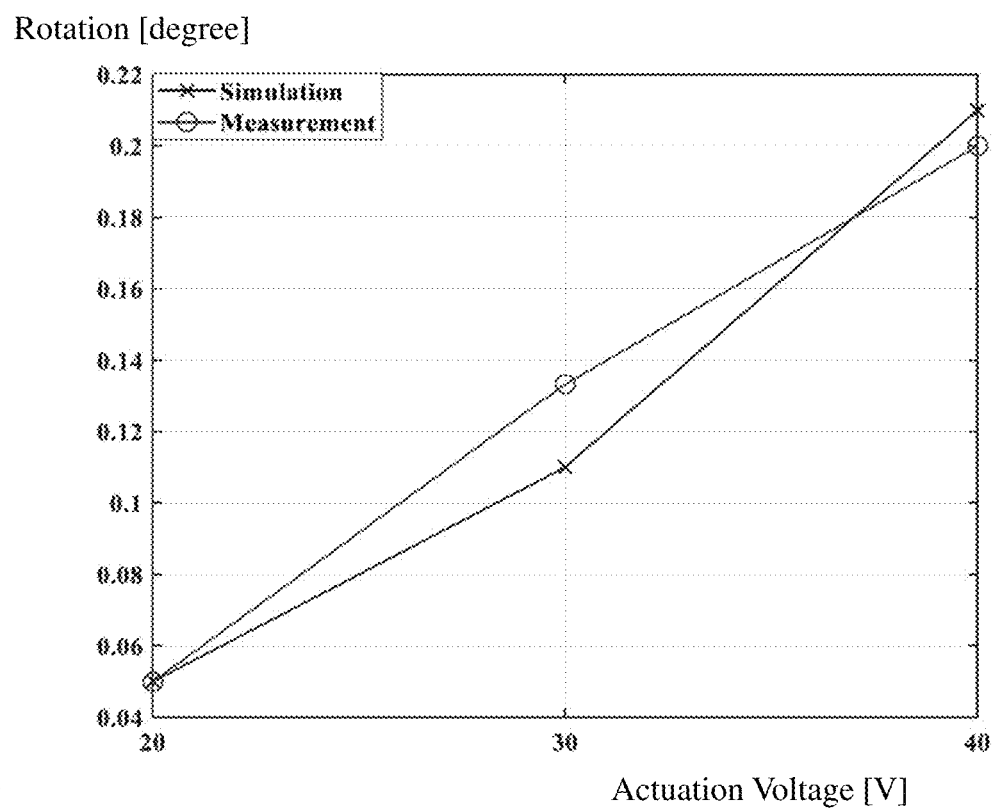

The capability of the invented actuator in producing rotational motion with different actuation voltages were numerically and experimentally studied, as depicted in FIG. 3. As evident the experimental results are comparable to the numerical results. By increasing the actuation voltage from 20 V to 40 V the actuation motion increased up to 4 µm. The corresponding angular displacement of the moveable plate with different voltages is presented in FIG. 4. The results obtained by experimental measurements confirm that a maximum rotation of 0.21 degree can be obtained if 40 V is applied to the actuator.

Figure 5A:
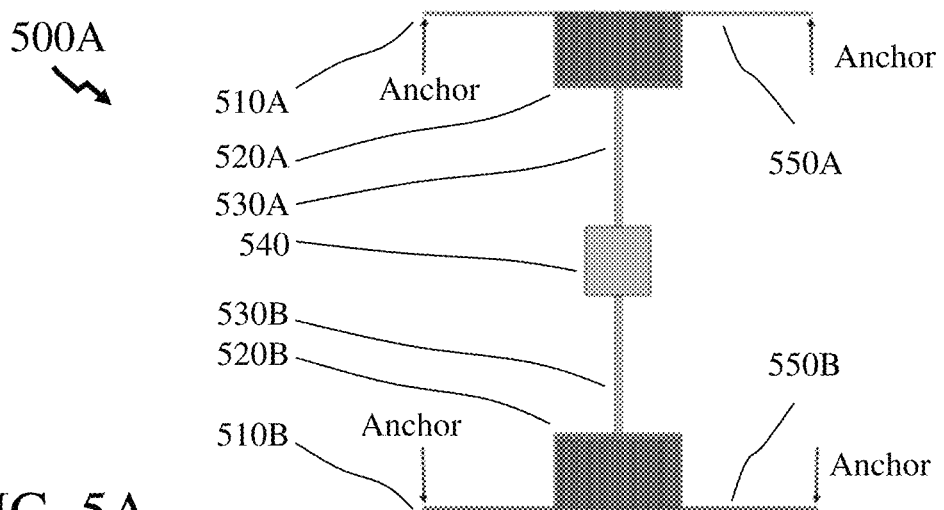
FIGS. 5A and 5B depict a structural diagram and optical micrograph of a translational electrostatic microelectromechanical systems (MEMS) actuator according to an embodiment of the invention.
Figure 5B:
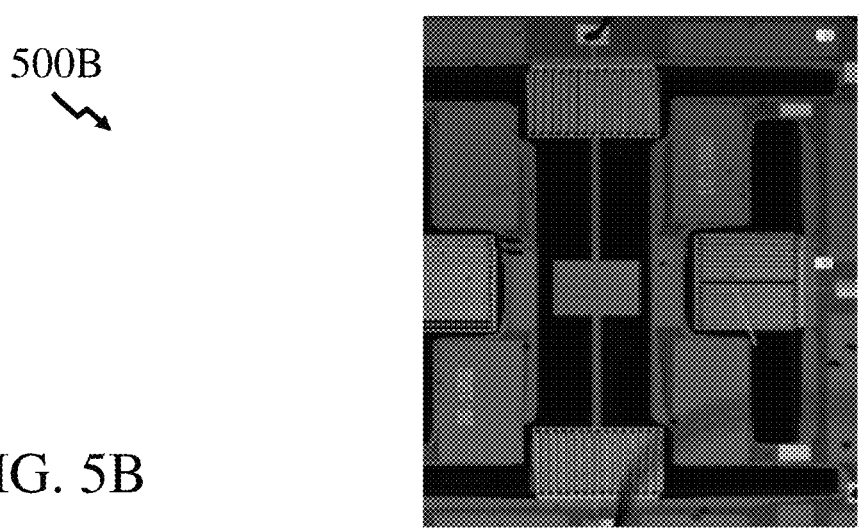

In order to provide a precise translational motion an alternate embodiment of the MEMS actuator according to an embodiment of the invention is depicted in FIG. 5A which is symmetrically anchored at four different locations, first Anchors 510A at one end and second Anchors 510B at the other end. As depicted the actuator comprises a pair of comb-drives, first and second Comb Drives 520A and 520B with each being coupled to one side of the Moveable Plate 540 via respective first and second Supporting Beams 530A and 530B, respectively. Accordingly, with identical first and second Comb Drives 520A and 520B then application of the same actuation voltage to both results in the Moveable Plate being uniformly moved away from the substrate because of its significantly lower stiffness coefficient along the z-axis. Accordingly, the MEMS actuator of FIG. 5A provides a z-axis MEMS actuator out-of-plane of the MEMS, i.e. the z-axis. FIG. 5B depicts an optical micrograph of a fabricated MEMS actuator according to the design of FIG. 5A fabricated using SOIMUMPs technology platform.

Figure 6:
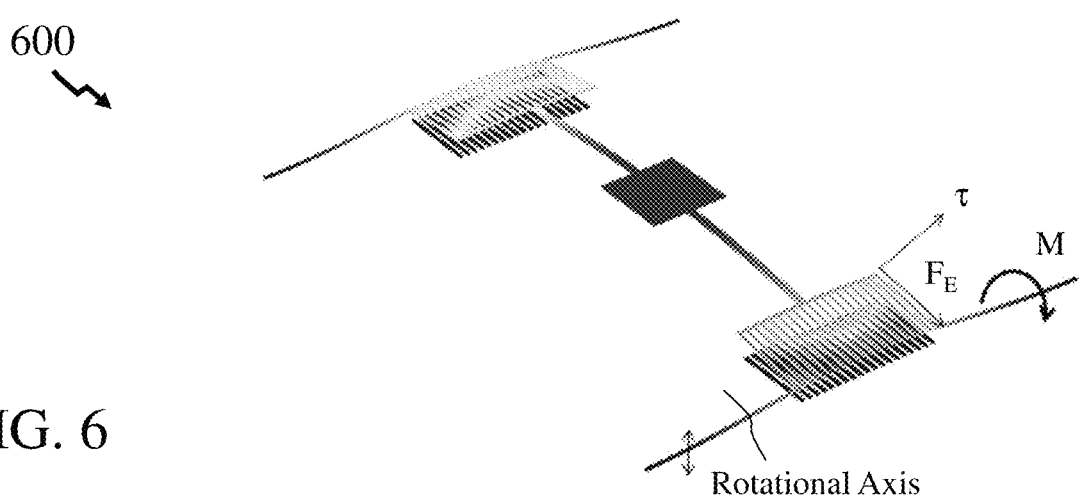
FIG. 6 depicts the simulated first mode shape of the translational electrostatic MEMS actuator according to the embodiment of the invention in FIG. 5A with equal voltages applied to both comb drives.

The actuator deflection is graphically depicted in FIG. 6. According to this figure, when the comb-drives are each equally rotated through their first and second Anchor Beams 550A and 550B respectively then the Moveable Plate 540 is moved. When the electrostatic actuation is away from the Moveable Plate 540 the resulting motions of the first and second Comb Drives 520A and 520B induce rotation within the first and second Anchor Beams 550A and 550B such that the Moveable Plate 540 moves further away from the substrate, i.e. a positive z-axis motion. Reversal of the electrostatic force results in reversal of the rotation etc. such that the Moveable Plate 540 moves towards the substrate, i.e. a negative z-axis motion.

Figure 7:
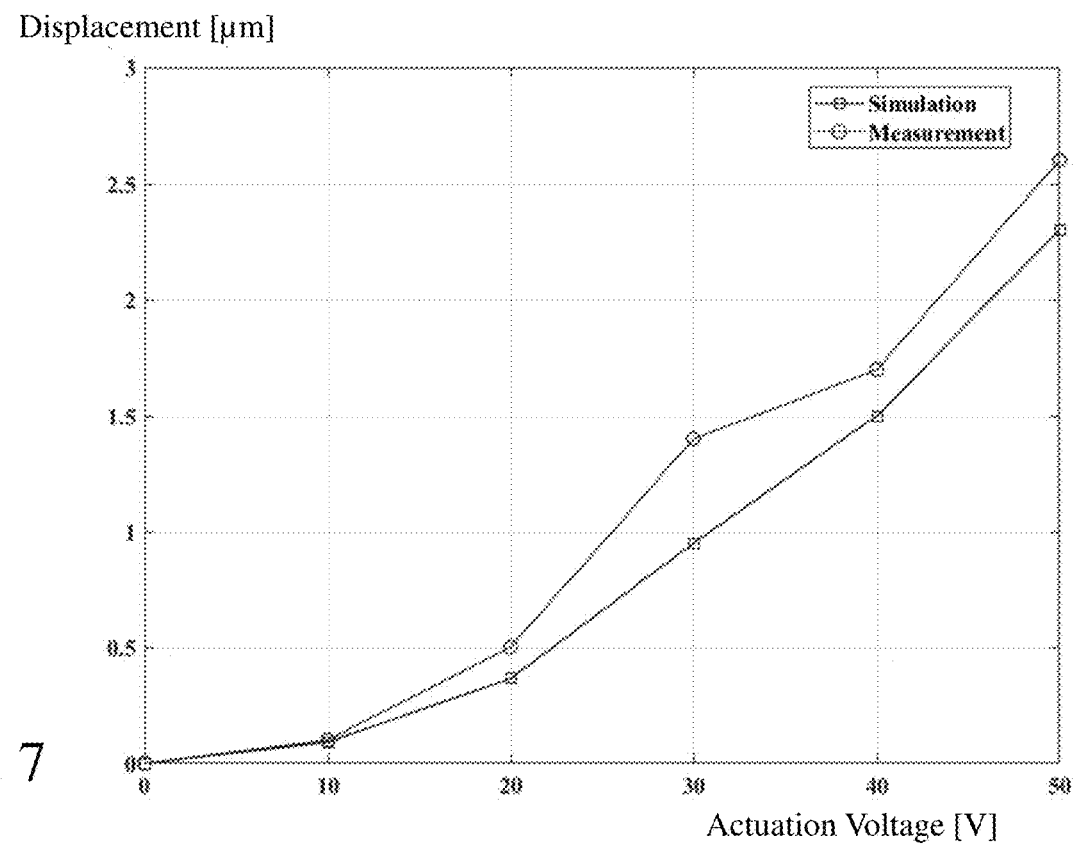
FIG. 7 depicts the generated translational motion for different actuation voltages for the fabricated translational electrostatic MEMS actuator according to the embodiment of the invention in FIG. 5A.

The actuator translational displacement for different actuation voltages obtained through numerical simulations and prototype measurements are shown in FIG. 7. From this, it can be concluded that increasing the actuation voltage increases the actuator displacement. Furthermore, the device motion is almost linear with respect to the applied voltage above a threshold voltage, approximately 20 V, which is highly desirable characteristic for MEMS actuator based micropositioners. As evident from 20 V to 40 V the range of vertical motion was approximately 1.9 µm.

Figure 8:
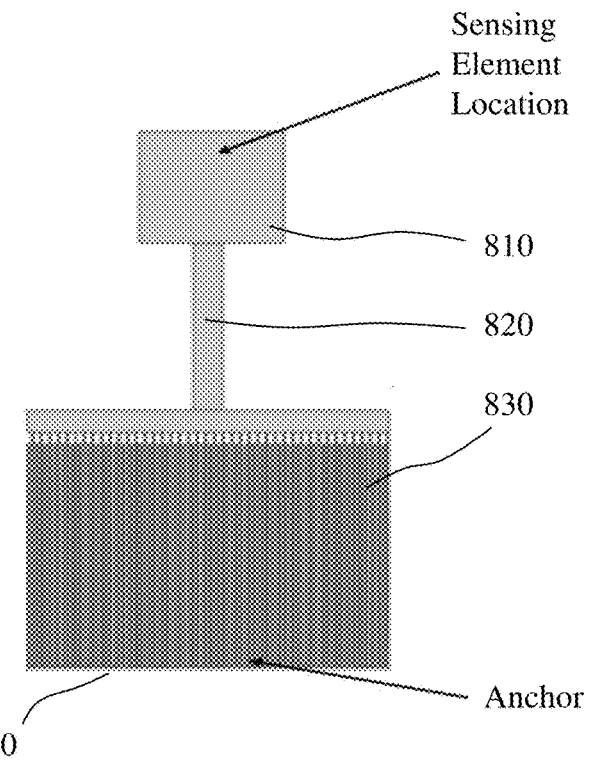
FIG. 8 depicts a structural diagram of a rotational electrostatic microelectromechanical systems (MEMS) actuator according to an embodiment of the invention.
Figure 9:
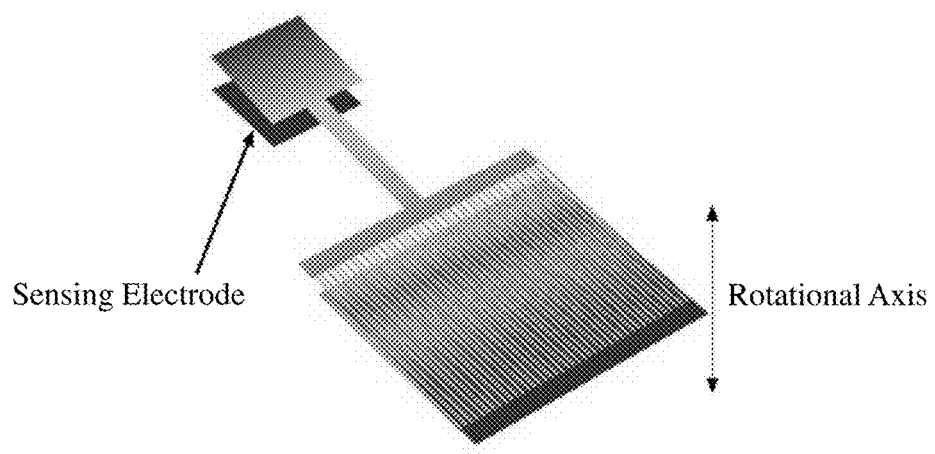
FIG. 9 depicts the simulated first mode shape of the rotational electrostatic MEMS actuator according to the embodiment of the invention in FIG. 8.

A structural diagram of another novel actuator for out-of-plane rotational motion with the self-sensing displacement capability is shown in FIG. 8. With reference to FIG. 8, the structure is fixed on one side, via Anchor 840 while the Moveable Plate 810 is attached to the suspended fingers of the Comb Drive 830 through a Supporting Beam 820. Disposed beneath the Moveable Plate 810, a fixed electrode is placed to measure the capacitance changes between the Moveable Plate 810 and this fixed electrode. Accordingly, this MEMS actuator according to an embodiment of the invention operates based on repulsive electrostatic force, therefore, the generated repulsive electrostatic force between the fixed and moveable fingers pushes the plate towards a point away from the surface. It is worth noting that the repulsive electrostatic force configuration is highly advantageous for generating large out-of-plane displacements for low actuation voltage. Further, as the MEMS actuator depicted in FIG. 8 requires two parallel conductive layers it can be readily adapted and fabricated with any standard fabrication processes having conductive layers on two different planes, such as PolyMUMPs from MEMSCAP Inc. or MicraGem-Si from Micralyne Inc. for example. Referring to FIG. 9, the mechanical mode shape of this rotational actuator is demonstrated where the lower sensing electrode is also evident beneath the moveable plate. Accordingly, the repulsive electrostatic force rotates the structure around its rotational axis.

Figure 10:
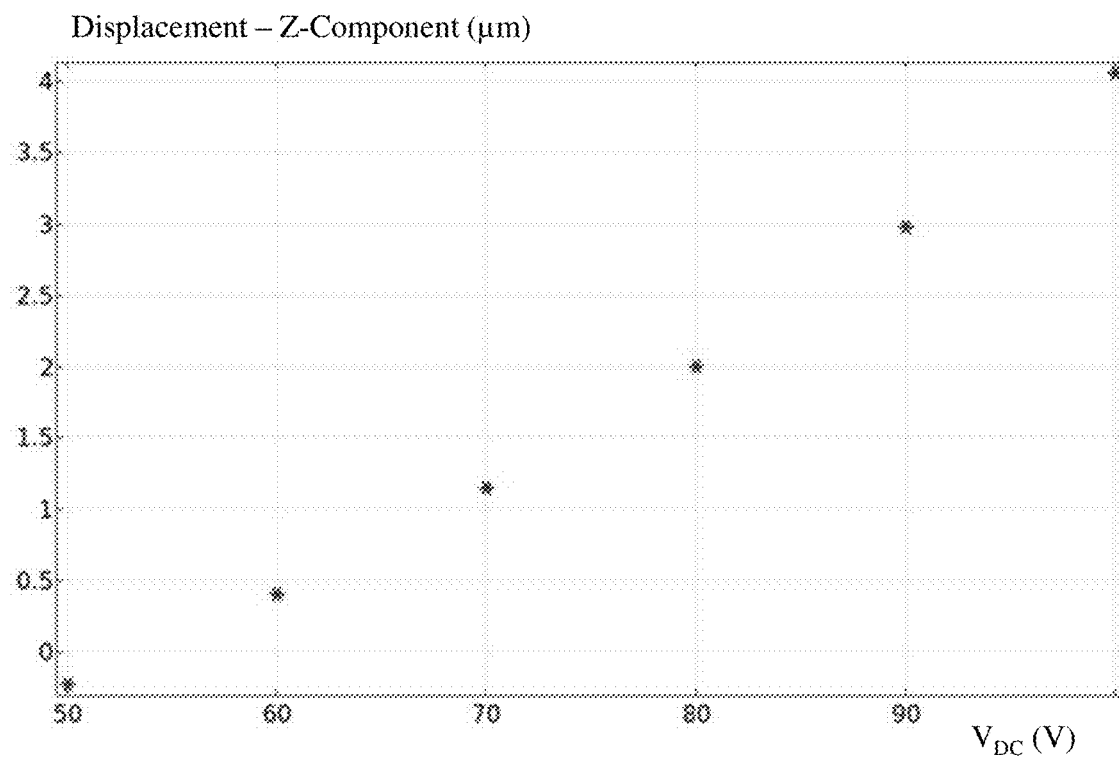
FIG. 10 depicts the generated rotational motion for different actuation voltages for different actuation voltages for the fabricated rotational electrostatic MEMS actuator according to the embodiment of the invention in FIG. 8.
Figure 11:
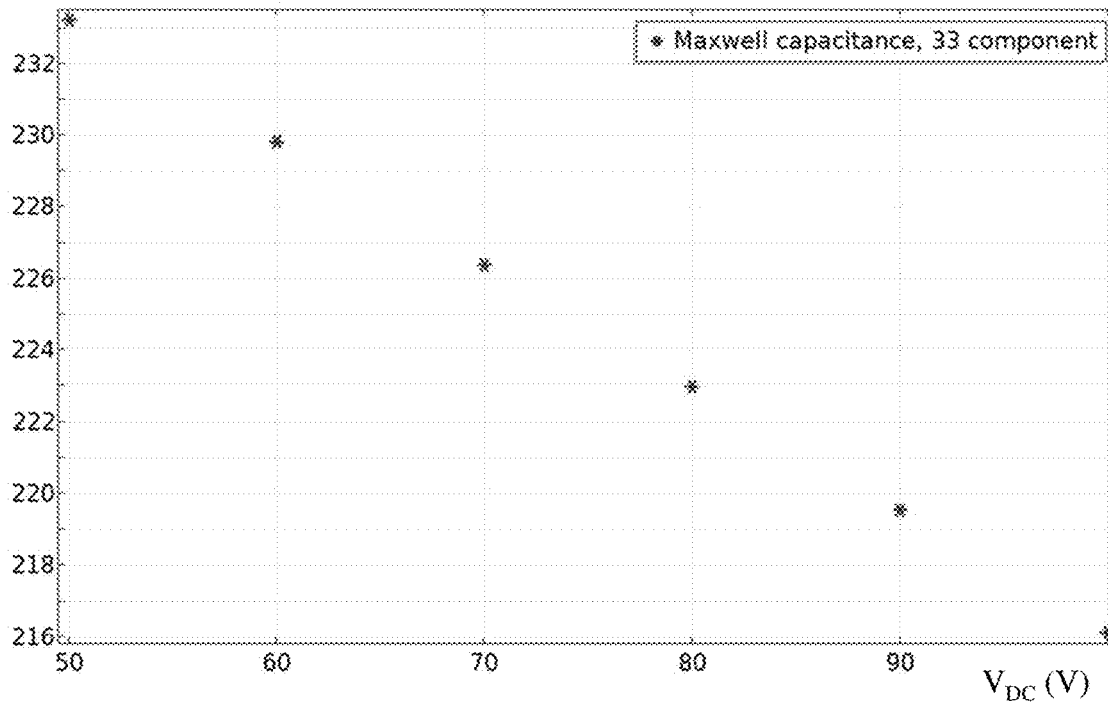
FIG. 11 depicts the capacitance change of the sensing electrode for different actuation voltages for the fabricated rotational electrostatic MEMS actuator according to the embodiment of the invention in FIG. 8.
Figure 12:
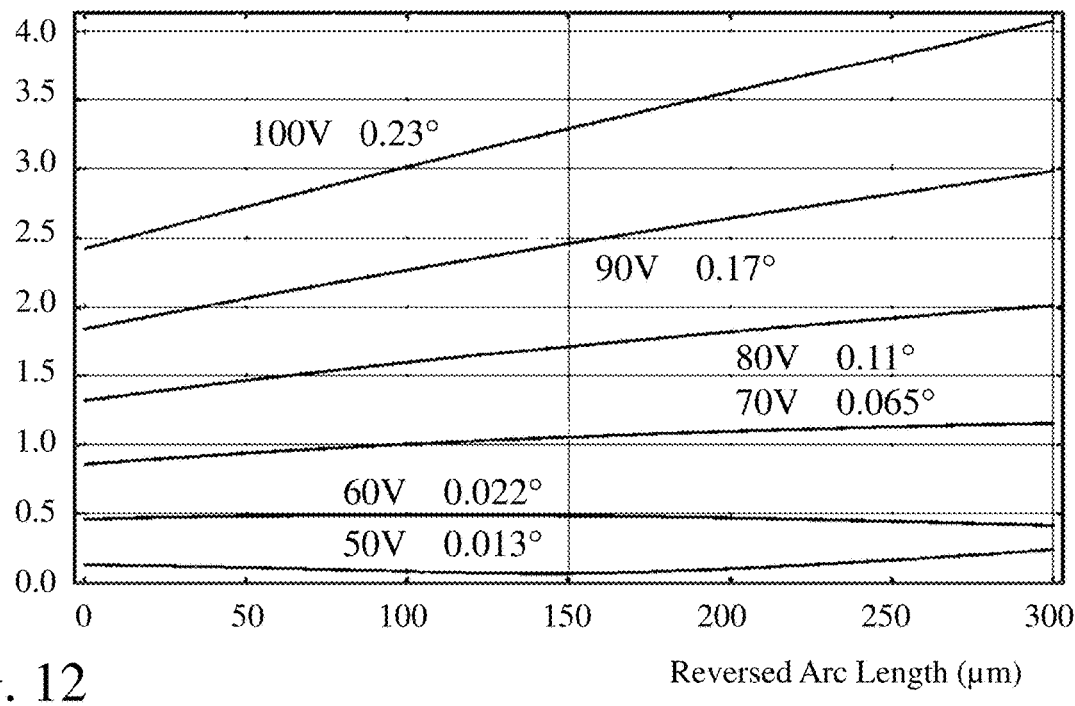
FIG. 12 depicts the generated angular displacement for different actuation voltages for the fabricated rotational electrostatic MEMS actuator according to the embodiment of the invention in FIG. 8.

In FIG. 10, the numerically calculated vertical displacement motion of the inventive MEMS actuator according to the embodiment of the invention depicted in FIG. 8 is presented as a function of actuation voltages. Similar to the inventive MEMS actuators described previously with respect to FIGS. 1A to 7, by increasing the actuation voltage from 50 V to 100 V the actuation motion increases up to 4 µm. The resulting capacitance of the sensing electrode, depicted in FIG. 11, reduces from approximately 233 fF at 50 V actuation voltage to approximately 216 fF at 100 V after the actuator motion of approximately 4 µm. Accordingly, the sensing capacitance slope if approximately 4.25 fF/µm. The corresponding angular displacement of the moveable plate with different voltages is presented in FIG. 12. According to this figure, a maximum rotation of 0.23 degree can be obtained for an applied voltage of 100 V to the actuator.

In order to provide a translational motion in the vertical direction, the MEMS actuator is adjusted in the same manner as between FIGS. 1A and 5A, respectively. Accordingly, the MEMS actuator depicted in FIG. 8 is modified to the design depicted in FIG. 13. Accordingly, the moveable platform is symmetrically anchored at two different sides. This actuator comprises a pair of identical comb-drives each coupled to one side of the moveable plate. Hence, by applying the same actuation voltages to both comb-drives the plate will be uniformly moved away from the substrate, due to the repulsive electrostatic force. It is worth noting that an essential difference between this actuator depicted in FIG. 13 and the one described in FIG. 5A as well as others within the prior art, is the addition to the self-sensing displacement capability, in conjunction with a large out-of-plane displacement at a low actuation voltage achieved by exploiting a repulsive electrostatic force configuration. In FIG. 14, the generated translational motion for different actuation voltages is depicted from which it is evident that a motion for the design of FIG. 14 of approximately 4 µm can be achieved for an actuation voltage of 100 V applied to the actuator.

It would be evident that whilst the potential applied to the moveable plate and the fixed electrode would be the same polarity to generate the electrostatic repulsion the magnitude of the potential applied to the moveable plate may be the same or different to the magnitude of the potential applied to the fixed electrode.

It would be evident that different vertical motion ranges may be achieved through design parameter variations of the MEMS actuators presented in FIGS. 1A, 5A, 8 and 13.

Figure 13:
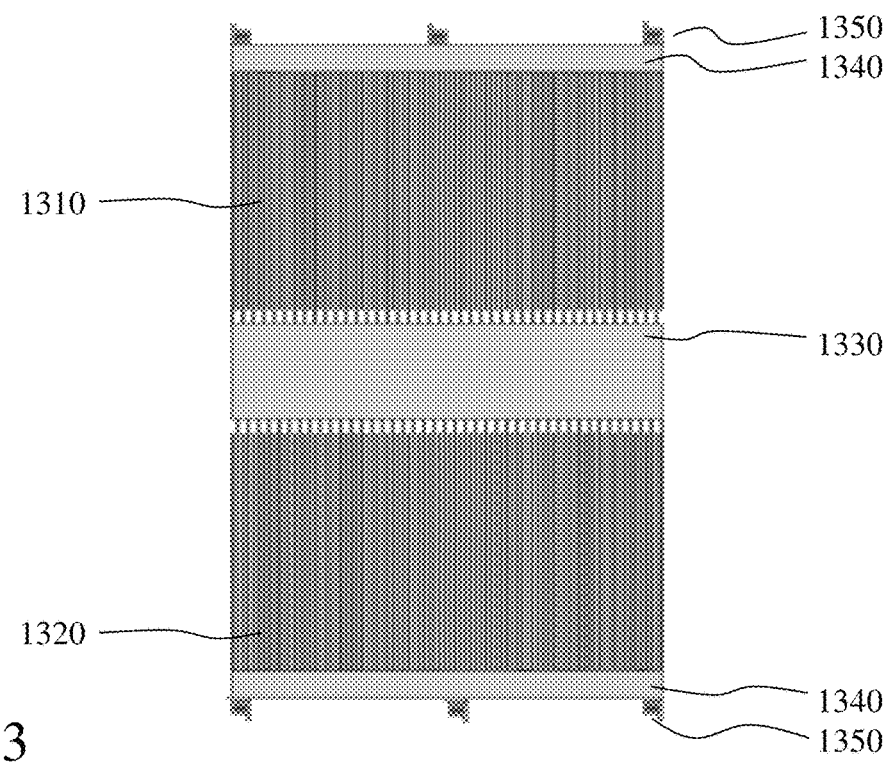
FIG. 13 depicts a structural diagram of a translational electrostatic microelectromechanical systems (MEMS) actuator according to an embodiment of the invention.
Figure 14:
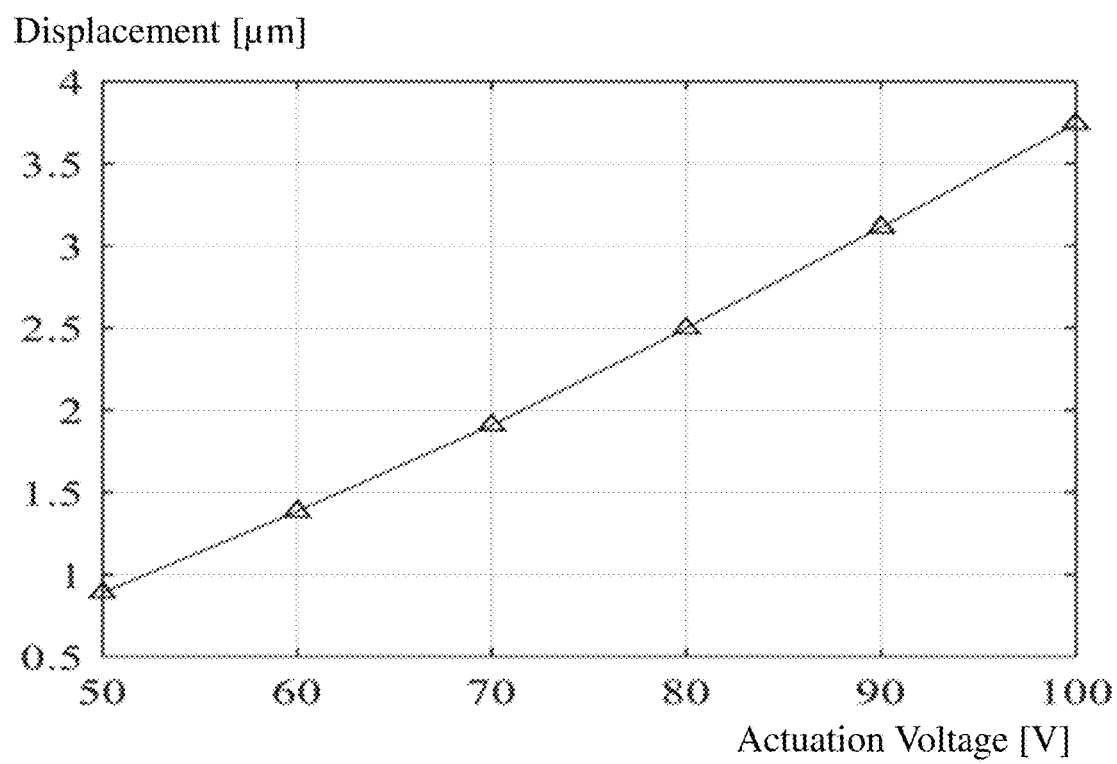
FIG. 14 depicts the generated translational motion for different actuation voltages for the fabricated translational electrostatic MEMS actuator according to the embodiment of the invention in FIG. 13.

It would be evident that with respect to FIGS. 5A and 13 that non-identical MEMS comb drives may be employed if required with corresponding adjustment of the actuation voltages to the pair of comb drives to compensate for their different designs.

2: Elliptical 3 Degree-of-Freedom Piezoelectric Actuator

Figure 15:
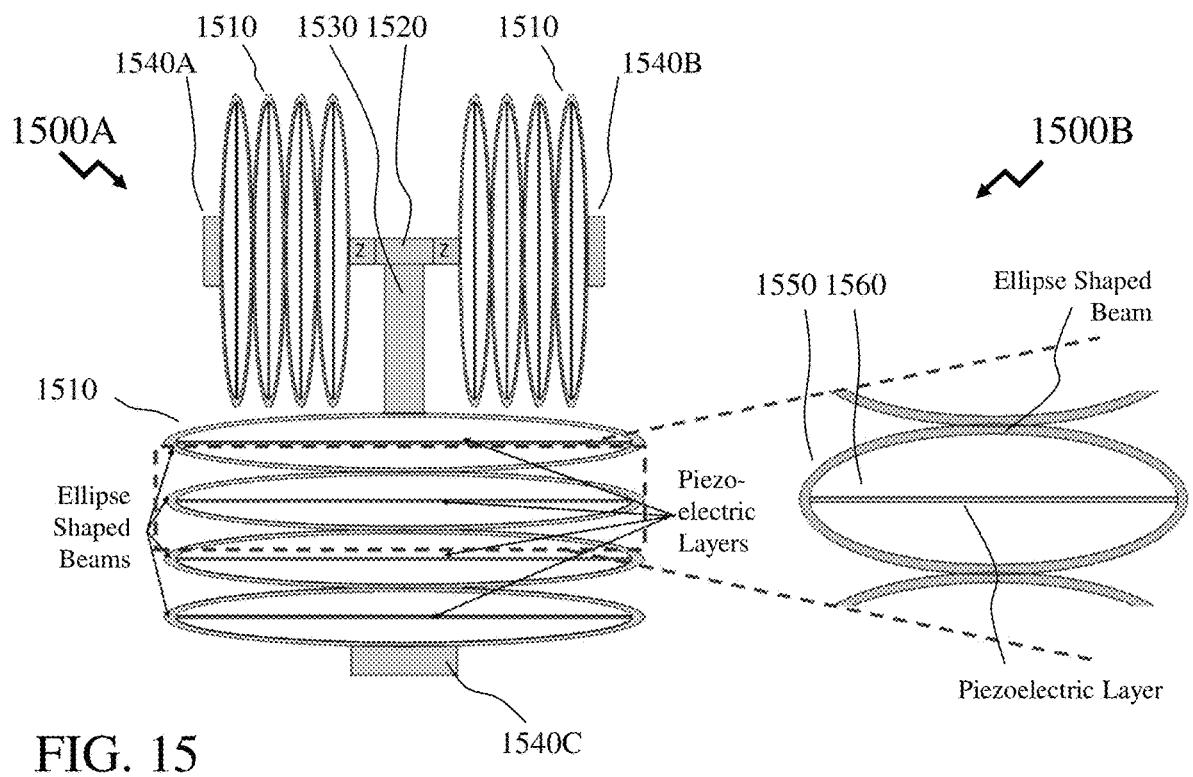
FIG. 15 depicts a structural diagram of a 3 degrees-of-freedom piezoelectric MEMS actuator according to an embodiment of the invention with zoom-in illustration the ellipse-shaped beam.

Now referring to FIG. 15 there is depicted a schematic of a piezoelectric actuator according to an embodiment of the invention providing a MEMS actuator providing both in-plane and out-of-plane motion. As depicted the MEMS actuator comprises a number of Elliptical Actuators 1510 comprising ellipse-shaped beams, Elliptical Beams 1550 in enlarged view, which have a piezoelectric layers deposited on their centers, Piezoelectric Element 1560 in enlarged view. Accordingly, a first set of Elliptical Actuators 1510 are disposed between a first Anchor 1540A on the left hand side of the MEMS actuator and a central first Beam 1520. A second set of set of Elliptical Actuators 1510 are disposed between a second Anchor 1540B on the right hand side of the MEMS actuator and a central first Beam 1520.

A third set of Elliptical Actuators 1510 are disposed between a third Anchor 1540C at the bottom of the MEMS actuator and a central second Beam 1530 which is coupled to the mid-point of the first Beam 1520. As depicted, each of the first, second, and third sets of Elliptical Actuators 1510 comprises four Elliptical Actuators 1510 each having an Elliptical Beam 1550 and a Piezoelectric Element 1560. The Piezoelectric Element 1560 may be a layer of piezoelectric material disposed without support or it may be supported by a thin beam of the MEMS. This thin beam may be continuous or segmented such that it comprises a series of sections jointed with thinner elements.

Figure 16:
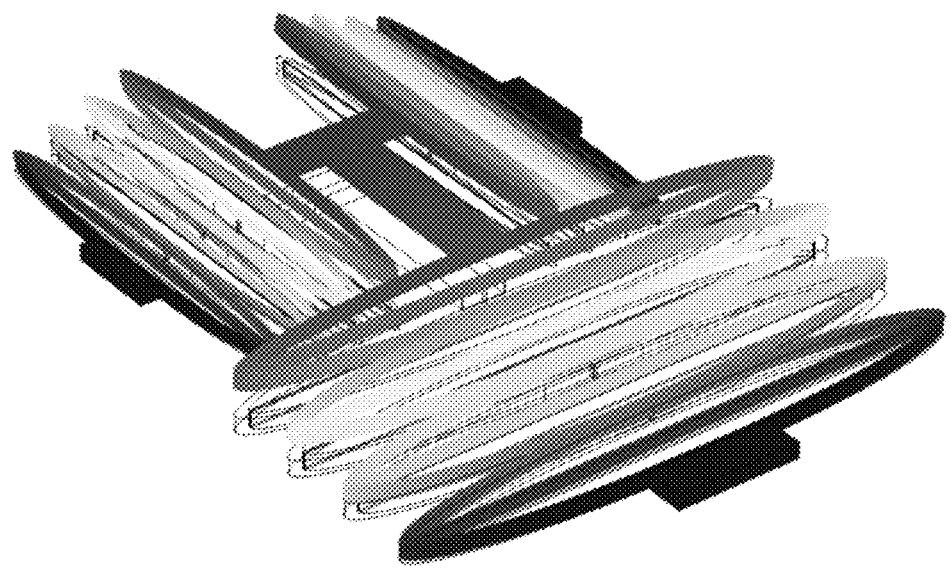
FIG. 16 depicts the simulated first mode shape of the 3 degrees-of-freedom piezoelectric MEMS actuator according to the embodiment of the invention in FIG. 15.

By applying voltages to the beams located along the x- and y-axis, displacement in the x and y directions will be produced, respectively. Moreover, vertical displacement is obtained by deformation of the piezoelectric layer deposited in the vicinity of movable plate, marked as Z in FIG. 15. In FIG. 16, the mechanical mode shape of the 3 degrees-of-freedom (DOF) actuator is shown.

Figure 17:
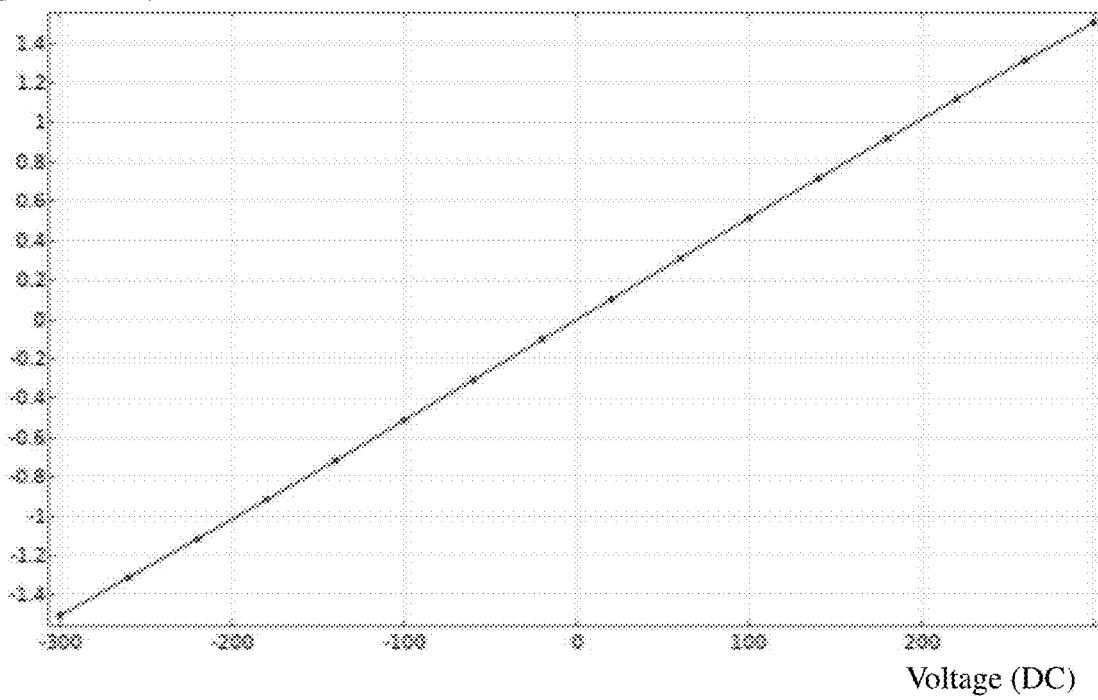
FIGS. 17 to 19 depict the generated translational motion for different actuation voltages for the fabricated 3 degrees-of-freedom piezoelectric MEMS actuator according to the embodiment of the invention in FIG. 15 in the x-axis, y-axis and z-axis respectively.
Figure 18:
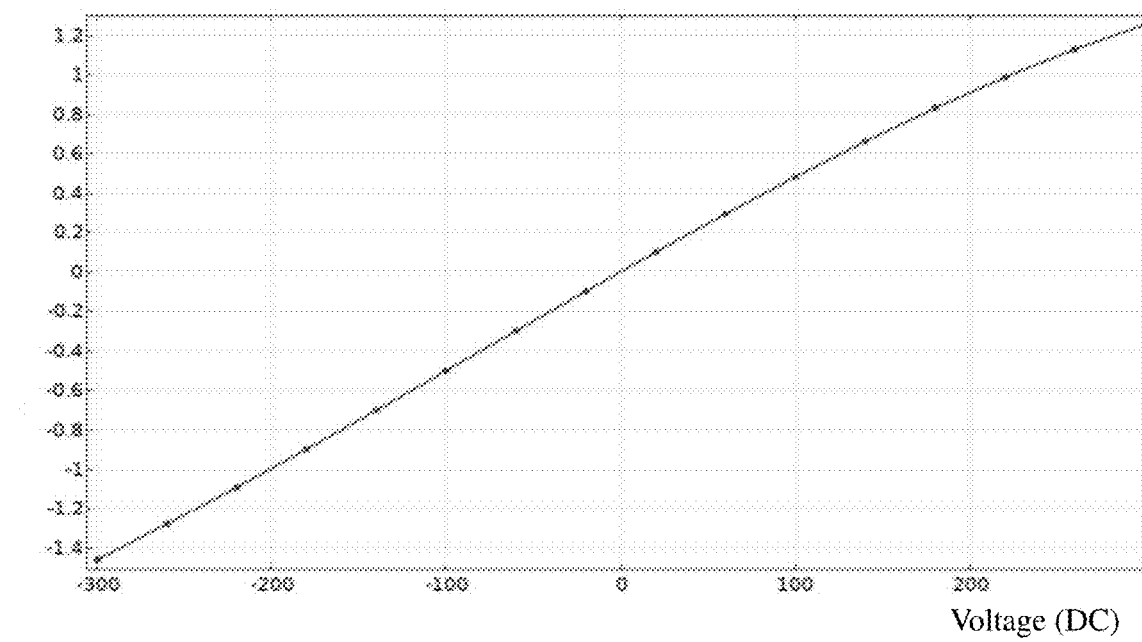
Figure 19:
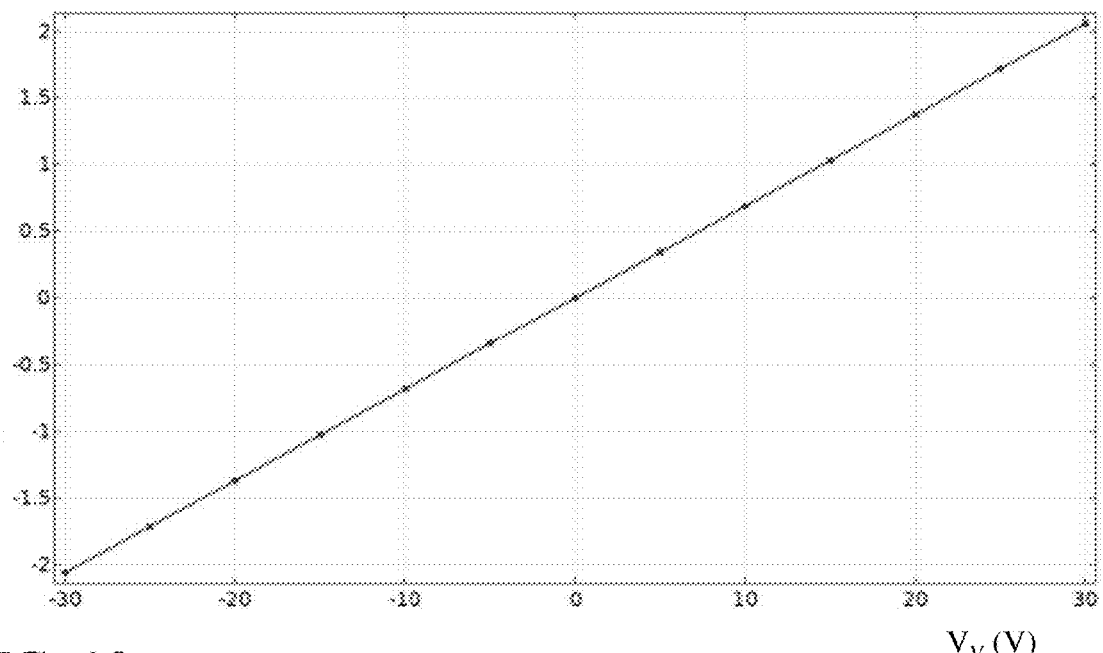

The numerical results obtained from FEM simulations when different voltages are applied to the piezoelectric actuators in x-, y-, and z-axis, are shown in FIGS. 17, 18 and 19, respectively. It can be seen that by changing the electrical potential polarity, i.e., positive to negative and vice versa, the direction of movement is also changed. Furthermore, the inventive MEMS actuator has a relatively linear response in all directions for a wide range of actuation voltage. As a result, positioning the MEMS actuator can be manipulated in three-axes with a relatively simple control circuit.

As depicted each Elliptical Actuator comprises a beam of predetermined thickness and predetermined width having a predetermined geometry having a major axis and a minor axis (typically orthogonal to the major axis). The piezoelectric layer being coupled to the beam at each end aligned with the major axis or substantially aligned with the major axis.

Beneficially, within embodiments of the invention one or more optical waveguides can be formed on the Elliptical Beams 1550 of the inventive MEMS actuator. Accordingly, referring to FIG. 20 an exemplary schematic of the electrical and optical connections for the inventive piezoelectric MEMS actuator is depicted. Based upon the geometry depicted then it is evident that there is a sufficiently large gap between the optical and electrical connections and that the optical waveguide(s) can be implemented with a large bending radius (approximately 150 µm).

Figure 20:
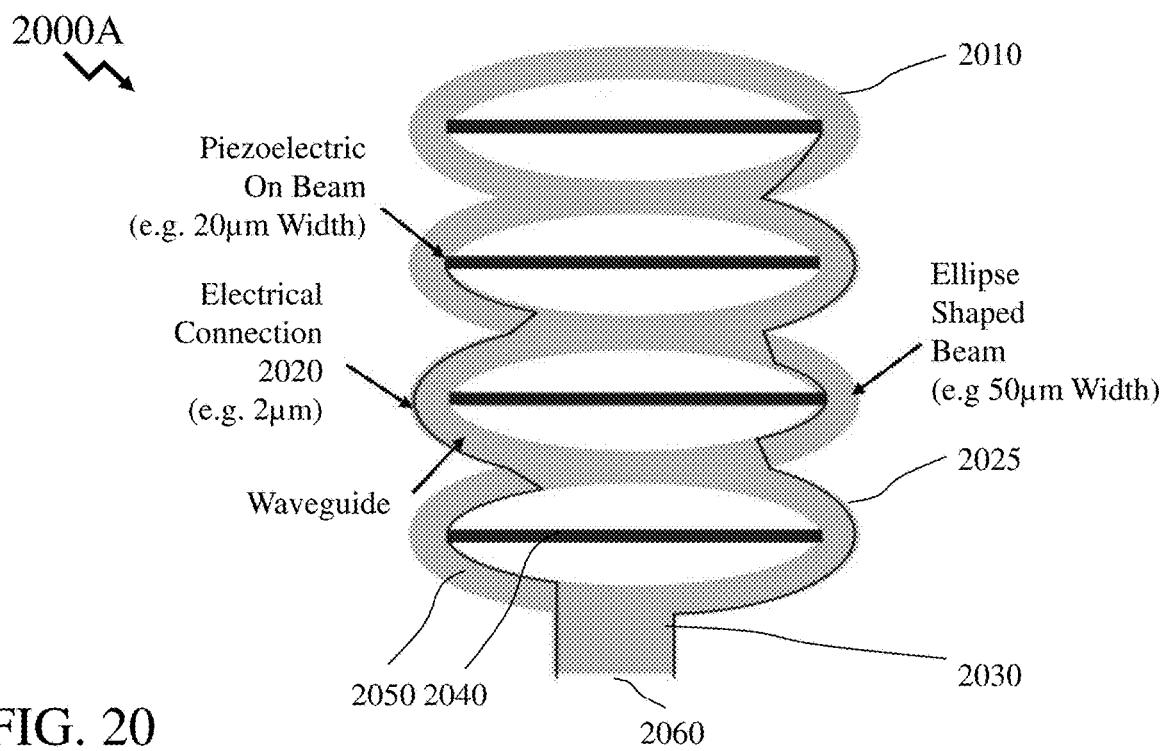
FIG. 20 depicts a schematic of optical waveguide and electrical connections for a piezoelectric actuator according to an embodiment of the invention.

Accordingly, in FIG. 20 a set of four Elliptical Actuators 2010 are depicted coupled in series. Each Elliptical Actuator 2010 comprising an Ellipse-Shaped Beam 2050 (of width 50 µm for example) with a Central Beam 2040 (of width 20 µm for example) disposed along the major axis of the Ellipse-Shaped Beam 2050. The set of four Elliptical Actuators 2010 are coupled to an Anchor 2030 at one end.

A first Electrical Connection 2020 (of width 2 µm for example) extends from the Anchor 2030 and connects with the piezoelectric layer disposed on the Central Beams 2040 of the first and third Elliptical Actuators 2010 in the set allowing these Elliptical Actuators 2010 to be driven as described above. A second Electrical Connection 2025 extends from the Anchor 2030 and connects with the piezoelectric layer disposed on the Central Beams 2040 of the second and fourth Elliptical Actuators 2010 in the set allowing these Elliptical Actuators 2010 to be driven as described above. It would be evident other electrical interconnection means and connection sequences may be employed within embodiments of the invention without departing from the scope of the invention.

Also disposed upon the Elliptical Actuators 2010 and extending from the Anchor 2030 to the last Elliptical Actuator 2010 in the set of Elliptical Actuators 2010 is an Optical Waveguide 2060, such as one employing a $SiO_2$—$Si_3N_4$—$SiO_2$ structure. Within other embodiments of the invention multiple optical waveguides may be supported by the set of Elliptical Actuators 2010 each running from the same or different locations on the set of Elliptical Actuators 2010 to/from the Anchor 2030 and therein to/from an optical circuit or circuits monolithically or hybridly integrated onto the same substrate as the MEMS device depicted in FIG. 20.

In a multi-degrees-of-freedom mechanical system, the cross-sensitivity between each individual axis indicates the system versatility as well as its precision level. The cross-sensitivities among the different axis of the inventive piezoelectric MEMS actuator are presented below in Table 2. As evident from the results depicted in Table 2 even for translations in excess of ±1.2 µm in the x- and y-axis and ±2.0 µm in the z-axis the cross-sensitivity remains below 10 nm, which confirms the stability of the novel MEMS actuator based micropositioner.

TABLE 2

| Computed Cross-Sensitivities Between Axes of 3 Degrees-of-Freedom Piezoelectric Actuator | | | |
|---|---|---|---|
| Actuation Axis | x | y | z |
| Cross-Sensitivity | 10 nm (y) | 3 nm (x) | 0.1 nm (x) |
|  | 3 nm (z) | 8 nm (z) | 0 nm (y) |

Figure 21:
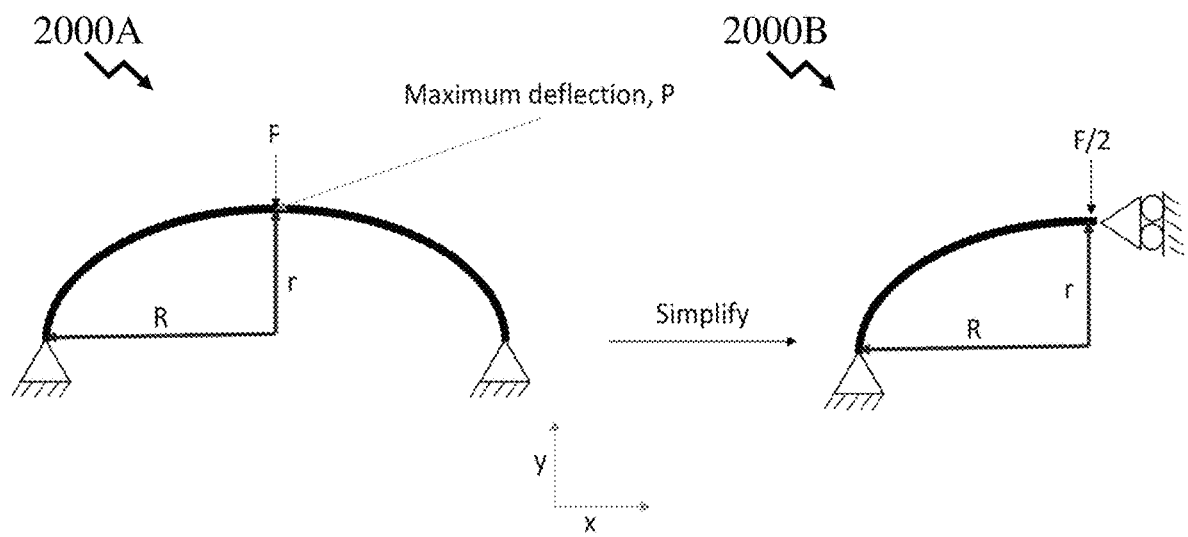
FIG. 21 depicts schematically the ellipse-shaped beam of a MEMS actuator according to an embodiment of the invention under clamped-clamped and clamped-simply supported boundary conditions.
Figure 22:
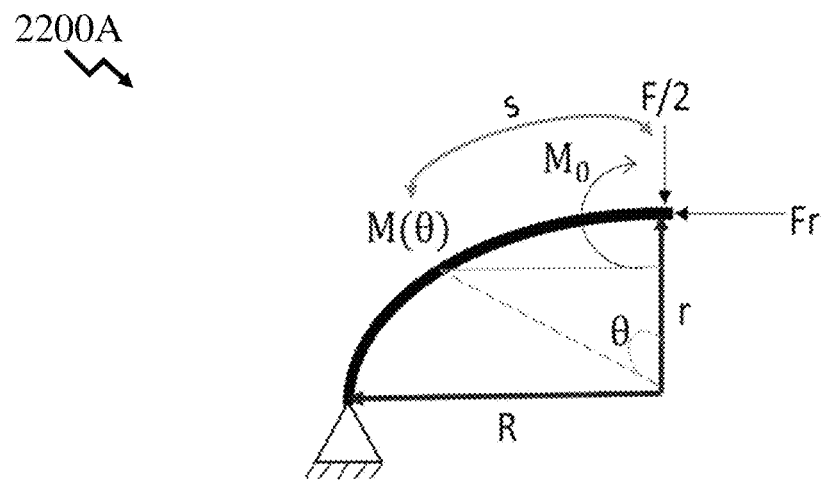
FIG. 22 depicts schematically the ellipse-shaped beam of a MEMS actuator according to an embodiment of the invention in a free-body diagram when an external force is applied at the centre of the MEMS actuator.

The inventive piezoelectric actuator was modeled analytically in order to optimize its performance. The elliptical-shaped beams in the piezoelectric actuator were assumed to behave as a clamped-clamped thin cantilever, as shown in first image 2100A in FIG. 21. Accordingly, as depicted in second image 2100B in FIG. 21, the whole structure can be simplified to a quarter of the ellipse with a clamped-simply supported boundary condition, since the ellipse-shaped structure is symmetric and moves only in the y-direction. Obviously, the maximum deflection point of this structure is at its center. Consequently, with reference to a free-body diagram, as shown in FIG. 22, the moment at a distance s from the external force, F/2, can be written as Equation (1) where $M_{F/2}$ is the moment due to the external force, $M_{Fr}$ is the moment due to the reaction force, and $M_0$ denotes the bending moment, respectively. Since the moment is a function of force and distance, Equation (1) can be rewritten as Equation (2).

$$M(\theta) = M_{\frac{F}{2}} + M_{F_r} - M_0 \quad (1)$$

$$M(\theta) = \frac{F}{2}R\sin(\theta) + F_r R(1 - \cos(\theta)) - M_0 \quad (2)$$

The deflections due to the reaction force and bending moment, which were assumed to be zero, can be computed by integrating the derivative of the moment as given by Equations (3A) and (3B) respectively. Hence, by solving Equations (3A) and (3B), the reaction force, Fr, and bending moment, $M_0$, are equal to the expressions in Equations (4A) and (4B) respectively.

Finally, by substituting Equations (4A) and (4B) into Equation (2), the deflection of the ellipse-shaped beam along the y-axis can be expressed as given by Equation (5) where n is the number of the beams, r is the minor radius, R is the major radius, E is the young's modulus, t is the thickness of beam, and w is the width of beam, respectively.

$$\delta_{F_r} = \frac{1}{E \cdot I} \int_0^{\frac{\pi}{2}} M(\theta) \frac{\delta M(\theta)}{\delta F_r} r d\theta = 0 \quad (3A)$$

$$\delta_{M_0} = \frac{1}{E \cdot I} \int_0^{\frac{\pi}{2}} M(\theta) \frac{\delta M(\theta)}{\delta M_0} r d\theta = 0 \quad (3B)$$

$$M_0 = -\frac{F(3R - \pi R)}{\pi^2 - 8} \quad (4A)$$

$$F_r = -\frac{2F(\pi - 4)}{\pi^2 - 8} \quad (4B)$$

$$\delta_{F_{\frac{1}{2}}} = \frac{1}{E \cdot I} \int_0^{\frac{\pi}{2}} M(\theta) \frac{\delta M(\theta)}{\delta F_{\frac{F}{2}}} r d\theta = \frac{12(2n+1)FrR^2(\pi^3 - 20\pi + 32)}{4Etw^3(8 - \pi^2)} \quad (5)$$

With reference to Equation (5), increasing the number of beams, in addition to enlarging the radius, results in enhancing the device motion. Moreover, reducing the width of beam can significantly increase the motion. It is worth pointing out that Equation 5 enables the design of efficient ellipse-shaped micropositioners.

It would be evident that within other embodiments of the invention other geometries other than elliptical may be employed for the actuators. Optionally, rather than a single piezoelectric layer, multiple piezoelectric layers may be employed. Optionally, other actuation means other than piezoelectric may be employed.

Within other embodiments of the invention an actuator element, such as a single Elliptical Actuator, may have multiple independently controllable piezoelectric layers disposed on orthogonal axes. Optionally, other actuation means other than piezoelectric may be employed.

It would be evident that within the embodiments of the invention presented the movable plate (support platform) connected to the MEMS actuators according to embodiments of the invention may itself comprise further MEMS actuators providing one or more of in-plane motion, in-plane rotation, out-of-plane motion, and out-of-plane rotation. For example, referring to FIG. 15 the second Beam 1530 and/or first Beam 1520 may form the movable plate (platform).

It would be evident that within the embodiments of the invention presented the movable plate (support platform) connected to the MEMS actuators according to embodiments of the invention may itself be mounted upon further MEMS actuators providing one or more of in-plane motion, in-plane rotation, out-of-plane motion, and out-of-plane rotation. For example, referring to FIG. 15 the second Beam 1530 and/or first Beam 1520 may form the movable plate (platform).

3: 3 Degrees-of-Freedom Electrostatic-Piezoelectric Actuator

Figure 23:
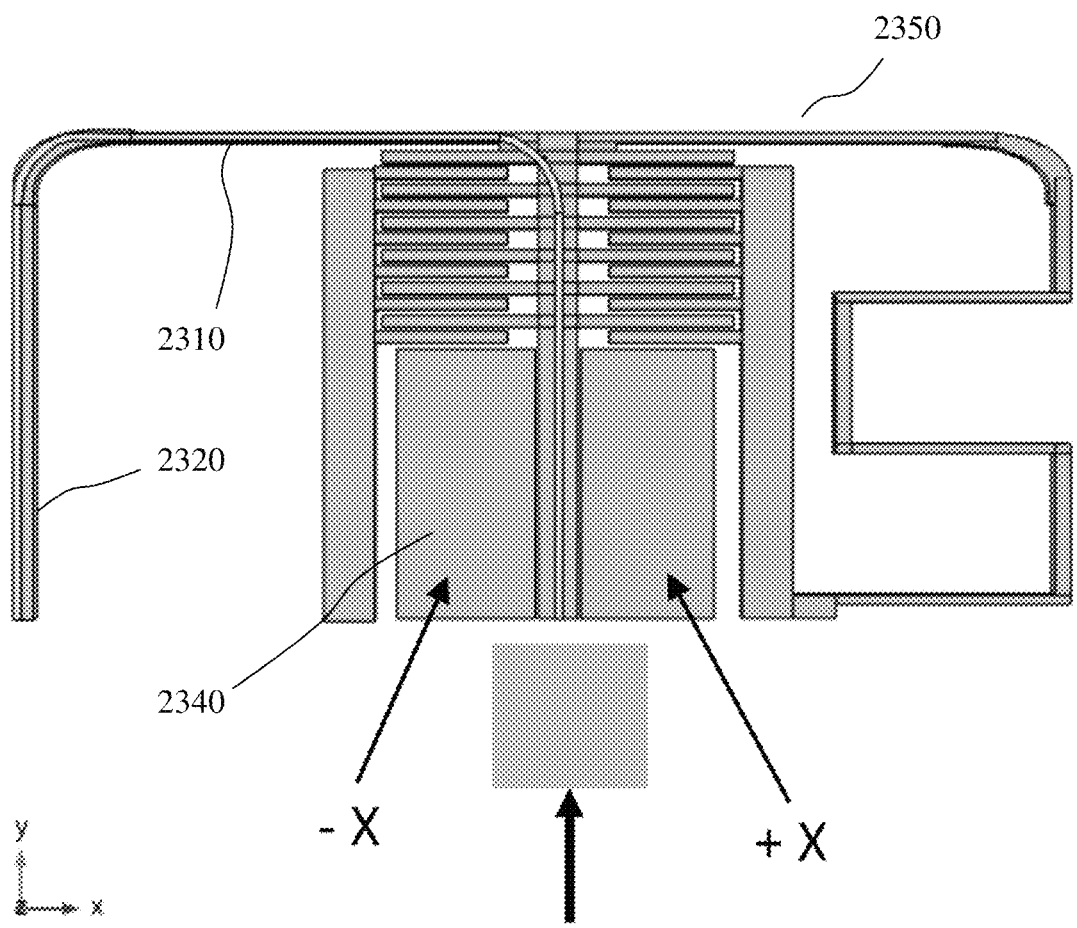
FIG. 23 depicts a structural diagram of a 3 degrees-of-freedom electrostatic-piezoelectric MEMS actuator according to an embodiment of the invention.

Referring to FIG. 23 there is depicted a schematic of a 3 degrees-of-freedom (DOF) MEMS actuator based micropositioner, which can provide displacement along x-, y-, and z-axis at a low actuation voltage. As depicted this novel MEMS actuator, with an overall physical footprint of 1370 μm×610 μm, exploits electrostatic actuation to move the platform in the x (positive and negative) and y directions, and the piezoelectric actuation provides the out-of-plane motion (z-direction). Since the micropositioner requires a low number of fingers, its fabrication yield is expected to be high.

Another advantage of this proposed micropositioner is its robustness to the mechanical stress generated by the materials forming the Optical Waveguide 2310 which is depicted as being supported by the left Beam 2320, Upper Beam 2350, and Moveable Platform 2340. According to simulation results, the initial deformation of the moveable part of the micropositioner due to the optical waveguide stress will not exceed 35 nm. Furthermore, the optical paths can be readily constructed on the suspended beams, hence, this micropositioner is a practical solution to provide MEMS based alignment between an optical component (e.g. an active semiconductor device such as LD or SOA) and the waveguide(s).

Figure 24:
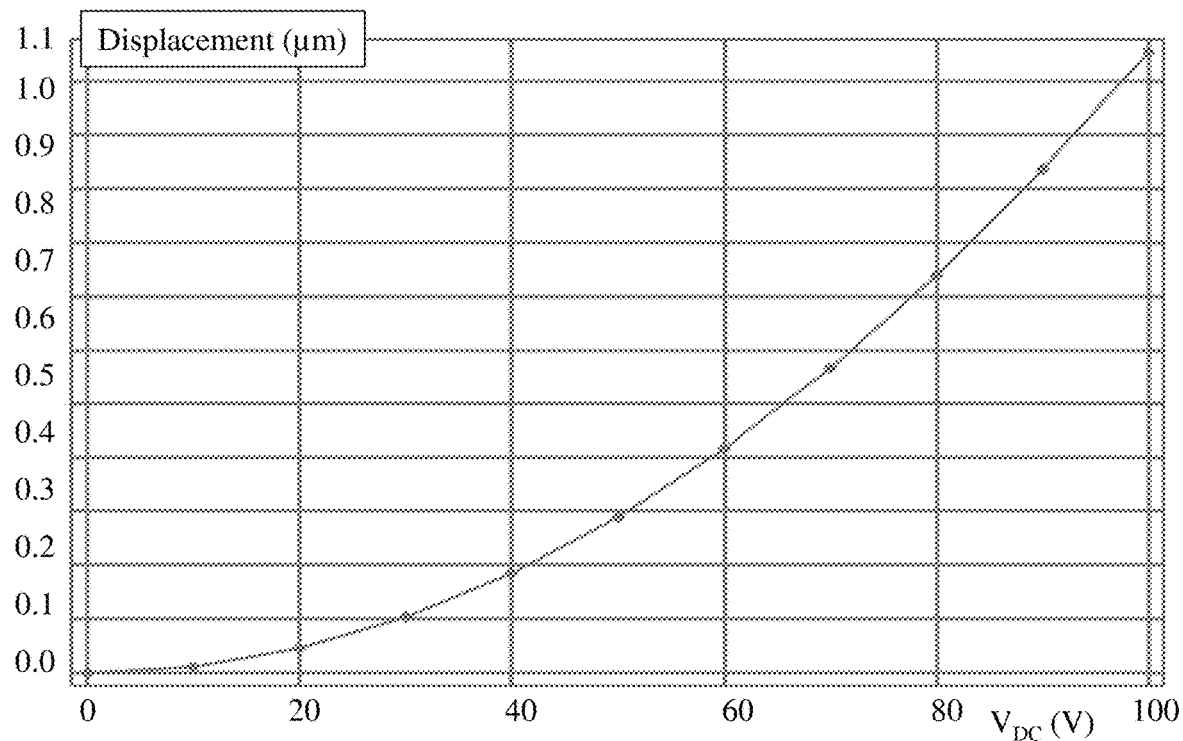
FIGS. 24 to 26 depict the generated translational motion for different actuation voltages for the fabricated 3 degrees-of-freedom electrostatic-piezoelectric MEMS actuator according to the embodiment of the invention in FIG. 24 in the x-axis, y-axis and z-axis respectively.
Figure 25:
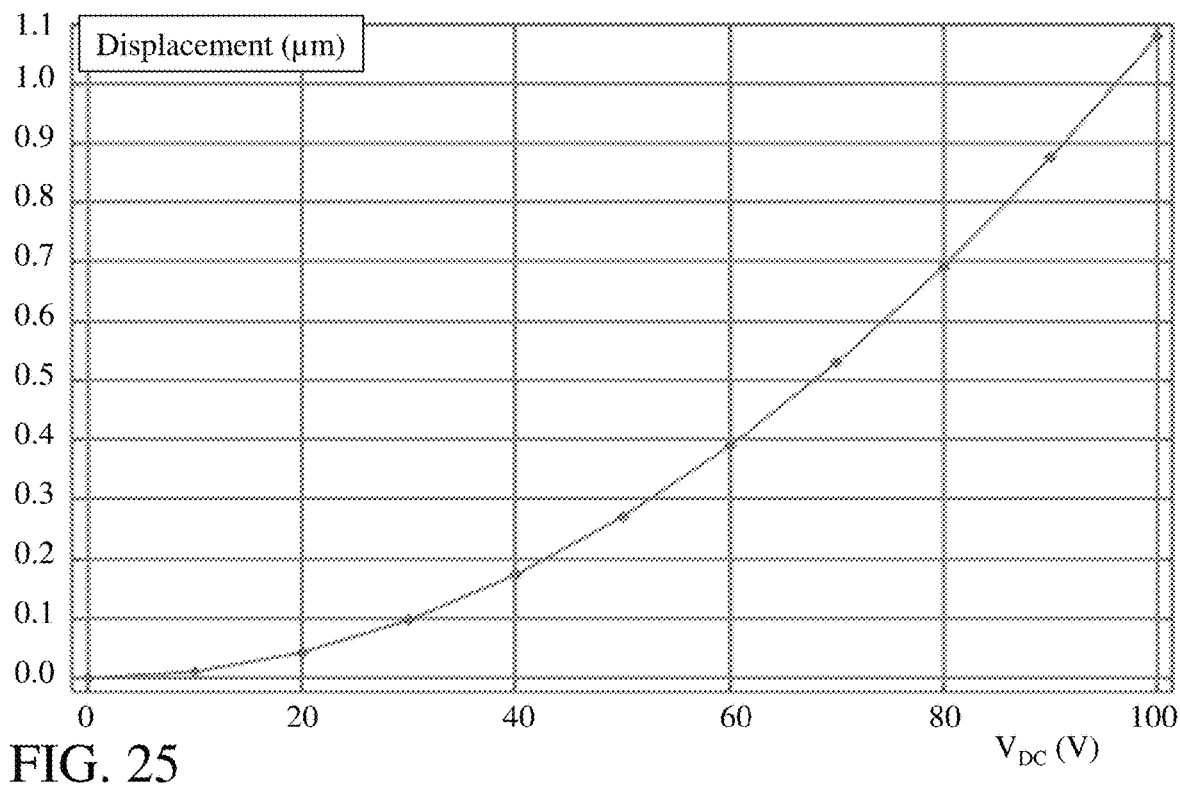
Figure 26:
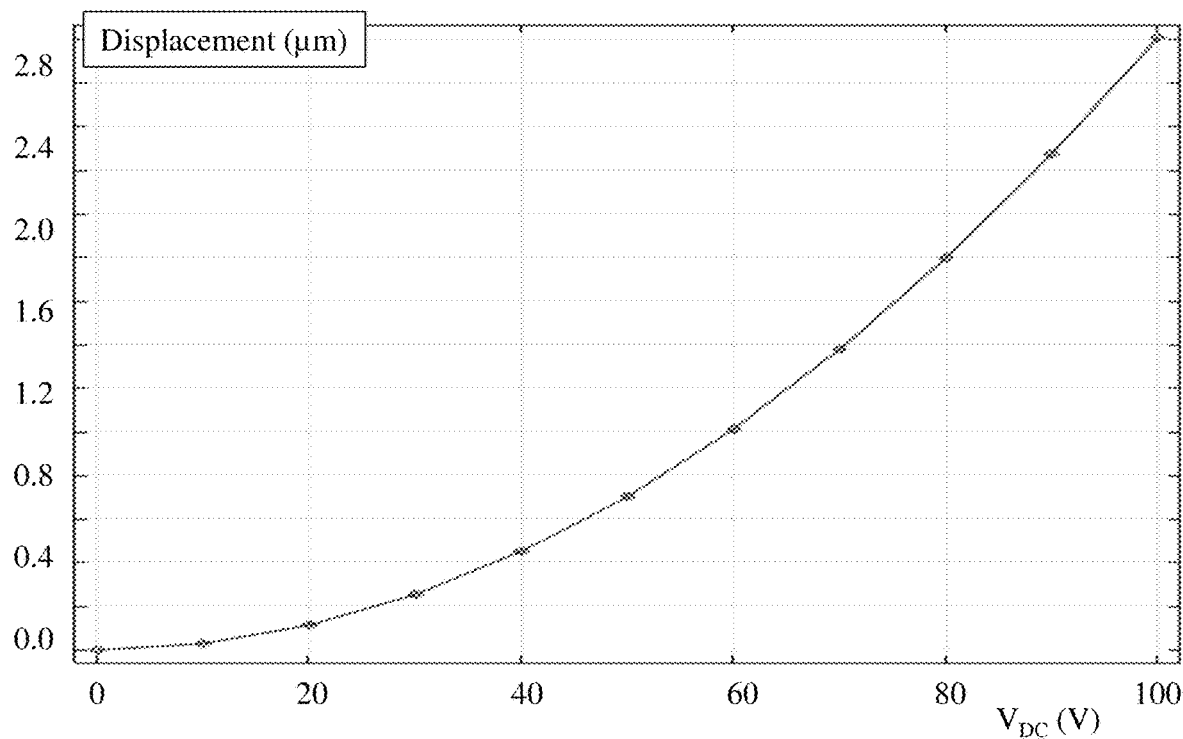

The numerical results obtained from FEM simulations when different voltages are applied to the actuators in x-, y-, and z-axis, are shown in FIGS. 24, 25 and 26, respectively. It can be seen that the micropositioner has a quadratic response along each axis. Moreover, the micropositioner is able to provide more than 1 μm of displacement along x- and y-axis and more than 2.5 μm along z-axis when a voltage of 100V DC is applied.

Figure 27:
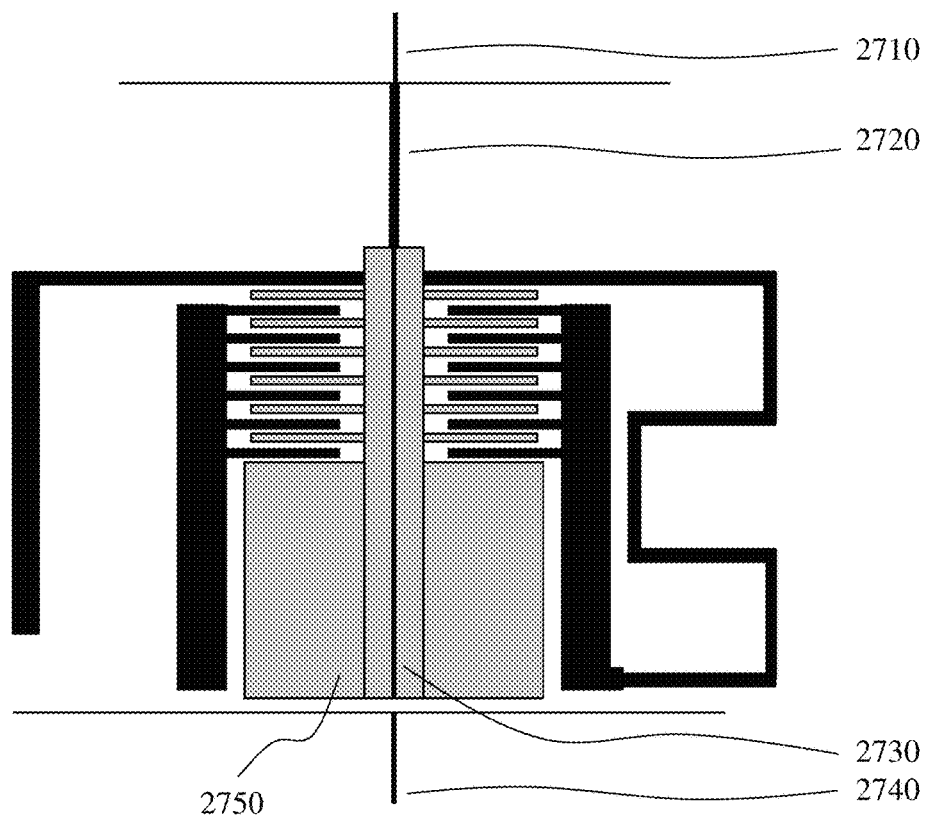
FIG. 27 depicts a schematic of the 3 degrees-of-freedom electrostatic-piezoelectric MEMS actuator according to the embodiment of the invention depicted in FIG. 23 depicting optical waveguides supported on the central platform for coupling to another optical element where the optical waveguides on the platform are coupled to flexible optical waveguides.

FIG. 27 depicts a schematic of the 3 degrees-of-freedom electrostatic-piezoelectric MEMS actuator according to the embodiment of the invention depicted in FIG. 23 depicting optical waveguides supported on the central platform for coupling to another optical element where the optical waveguides on the platform are coupled to flexible optical waveguides. Accordingly, upon a Platform 2750 of the 3 degrees-of-freedom electrostatic-piezoelectric MEMS actuator is depicted a first Suspended Waveguide 2730 which terminates proximal a facet of the Platform 2750. Upon another facet opposite the Platform 2750 is a first Non-Suspended Waveguide 2740 which is formed upon the substrate upon which the 3 degrees-of-freedom electrostatic-piezoelectric MEMS actuator and other elements are fabricated. Accordingly, motion of the 3 degrees-of-freedom electrostatic-piezoelectric MEMS actuator provides for X, Y and Z translation of the first Suspended Waveguide 2730 through motion of the Platform 2750 relative to the first Non-Suspended Waveguide 2740.

The other end of the first Suspended Waveguide 2730 distal to that terminating proximal the facet is mechanically and optically coupled to a first end of a second Suspended Waveguide 2720 such as a silicon nanowire, photonic wirebond, silicon oxide clad silicon nitride core optical waveguide, etc. The second distal end of the second Suspended Waveguide 2720 is coupled optically and mechanically to second Non-Suspended Waveguide 2710 which is formed upon the substrate upon which the 3 degrees-of-freedom electrostatic-piezoelectric MEMS actuator and other elements are fabricated. Accordingly, motion of the Platform 2750 results in flexure of the second Suspended Waveguide 2720.

Optionally, the first Non-Suspended Waveguide 2740 may be a waveguide or optical element upon a die which has been mounted to the substrate as that upon which the 3 degrees-of-freedom electrostatic-piezoelectric MEMS actuator and other elements are fabricated. For example, the first Non-Suspended Waveguide 2740 may be a stripe waveguide of a laser diode.

Accordingly, within the previous description several novel MEMS actuators exploiting micromechanical structures have been presented for producing both out-of-plane and in-plane motions including transitional and rotational displacements.

Beneficially, a low stiffness mechanical structure along the z-axis with in-plane electrostatic actuation can provide out-of-plane motion. In this actuator, both sections of the comb can be advantageously fabricated in the same plane, which reduces the complexity of fabrication.

In order to use the micropositioner in a close-loop control system as a self-aligned system, a novel micromechanical actuator based on repulsive electrostatic force with the capability of self-sensing displacement for producing both rotational and translational movements was presented. One of this actuator's benefits being the ability to provide large deflection along the z-axis at a low actuation voltage through the use of a repulsive electrostatic force. Accordingly, the MEMS actuator footprint can be reduced to a few hundred square micrometers and still provide approximately 1 µm vertical displacement at a voltage less than 100 V.

Additionally, to further support versatility of the MEMS actuator based micropositioners, an ellipse-shaped actuator based on piezoelectric forces, which can move along x-, y-, z-axis, was presented. Beneficially, in contrast to prior art 3-axes MEMS actuators the design supports the ability to route optical paths, i.e., optical waveguides, on its surface. Beneficially, the design provides a low cross-sensitivity among each individual axis making it a feasible solution to effectively and efficiently provide micropositioning, such as to eliminate misalignment between a passive optical waveguide and an active semiconductor die.

Finally, to minimize the operating voltage as well as enhance yield, a novel three degrees-of-freedom micropositioner based on both piezoelectric and electrostatic forces was presented. In this actuator, the attractive electrostatic force is used to produce in-plane motions (i.e., x- and y-axis), while the vertical displacement is generated by the piezoelectric force. Similar to the other disclosed MEMS actuators this actuator supports integration with optical waveguide(s) which can be routed on the surface of the MEMS actuator. The performance of the novel MEMS micropositioner was studied through comprehensive FEM simulations where it was evident that the mechanical stress created by the optical waveguide(s) had negligible impact on the performance of the MEMS actuator. Such a robust response makes the actuator capable to provide precise alignment.

Specific details are given in the above description to provide a thorough understanding of the embodiments. However, it is understood that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A microelectromechanical systems (MEMS) device comprising:
    an anchor beam coupled to a first portion of a comb drive having an end anchored to a substrate upon which the MEMS device is formed on one side of the first portion of the comb drive and another distal end anchored to the substrate on another side of the first portion of the comb drive opposite the one side; and
    a structure comprising
        the comb drive comprising the first portion and a second portion, the first portion and second portion providing a set of interdigitated fingers;
        a support beam coupled at one end to the second portion of the comb drive and at another distal end coupled to a moveable plate; and
    the moveable plate suspended from the substrate; wherein
    activation of the comb drive in a direction pushes the first portion of the comb drive attached to the anchor beam away from the moveable plate inducing rotation of the structure and anchor beam in another direction and thereby motion of the moveable plate in a further direction; and
    activation of the comb drive in another direction opposite the first direction pulls the first portion of the comb drive attached to the anchor beam towards the moveable plate inducing rotation of the structure and anchor beam in a direction opposite that of the other direction and thereby motion of the moveable plate in a direction opposite that of the further direction.

2. The MEMS device according to claim 1, further comprising:
    another anchor beam coupled to the first portion of the another comb drive having an end anchored to the substrate is formed on one side of the first portion of the another comb drive and another distal end anchored to the substrate on another side of the first portion of the another comb drive opposite the one side; and another structure comprising:
another comb drive comprising another first portion and another second portion, the first portion and second portion providing another set of interdigitated fingers; and
another support beam coupled at one end to the second portion of the another comb drive and at another distal end coupled to the moveable plate; wherein
activation of the another comb drive in a direction pushes the first portion of the another comb drive attached to the another anchor beam away from the moveable plate inducing rotation of the structure and another anchor beam in another direction and thereby motion of the moveable plate in the further direction; and
activation of the another comb drive in another direction opposite the first direction pulls the first portion of the another comb drive attached to the another anchor beam towards the moveable plate inducing rotation of the structure and another anchor beam in a direction opposite that of the other direction and thereby motion of the moveable plate in a direction opposite that of the further direction.

3. A microelectromechanical systems (MEMS) device comprising:
an anchor coupled to a first portion of a comb drive anchored to a substrate upon which the MEMS device is formed; and
a structure comprising:
a comb drive comprising a first portion and a second portion, the first portion and second portion providing a set of interdigitated fingers; and
a support beam coupled at one end to the second portion of the comb drive and at another distal end coupled to a moveable plate; and
the moveable plate suspended from the substrate; wherein
activation of the comb drive in a direction pushes the first portion of the comb drive attached to the anchor beam away from the moveable plate inducing rotation of the structure and anchor in another direction and thereby motion of the moveable plate in a further direction; and
activation of the comb drive in another direction opposite the first direction pulls the first portion of the comb drive attached to the anchor beam towards the moveable plate inducing rotation of the structure and anchor in a direction opposite that of the other direction and thereby motion of the moveable plate in a direction opposite that of the further direction.

4. The MEMS device according to claim 3, further comprising a fixed electrode disposed beneath the moveable plate coupled to the substrate; wherein application of a voltage to the comb drive to induce rotational movement of the second portion of the comb drive relative to the first portion of the comb drive;
movement of the moveable plate relative to the substrate is induced in dependence upon the rotational movement of the second portion of the comb drive; and
a magnitude of a capacitance between the moveable plate and the fixed electrode varies in dependence upon the induced movement of the moveable plate relative to the fixed electrode.

5. The MEMS device according to claim 3, further comprising
a fixed electrode disposed beneath the moveable plate coupled to the substrate; wherein
the moveable plate can be moved relative to the fixed electrode by at least one of:
applying a first voltage to the comb drive to induce rotational movement of the second portion of the comb drive relative to the first portion of the comb drive and therein movement of the moveable plate relative to the substrate is induced in dependence upon the rotational movement of the second portion of the comb drive; and
applying a second voltage to at least one of the moveable plate and the fixed electrode to induce at least one of electrostatic attraction and electrostatic repulsion between the moveable electrode and the fixed electrode; and
a magnitude of a capacitance between the moveable plate and the fixed electrode varies in dependence upon the induced movement of the moveable electrode relative to the fixed electrode.

6. The MEMS device according to claim 3, further comprising:
another anchor beam coupled to the first portion of the another comb drive having an end anchored to the substrate is formed on one side of the first portion of the another comb drive and another distal end anchored to the substrate on another side of the first portion of the another comb drive opposite the one side; and
another structure comprising:
another comb drive comprising another first portion and another second portion, the first portion and second portion providing another set of interdigitated fingers; and
another support beam coupled at one end to the second portion of the another comb drive and at another distal end coupled to the moveable plate; wherein
activation of the another comb drive in a direction pushes the first portion of the another comb drive attached to the another anchor beam away from the moveable plate inducing rotation of the structure and another anchor in an other direction and thereby motion of the moveable plate in the further direction; and
activation of the another comb drive in another direction opposite the first direction pulls the first portion of the another comb drive attached to the another anchor beam towards the moveable plate inducing rotation of the structure and another anchor in a direction opposite that of the other direction and thereby motion of the moveable plate in a direction opposite that of the further direction.

7. The MEMS device according to claim 6, further comprising
a fixed electrode disposed beneath the moveable plate coupled to the substrate; wherein
the moveable plate can be moved relative to the fixed electrode by at least one of:
applying a first voltage to the comb drive to induce rotational movement of the second portion of the comb drive relative to the first portion of the comb drive;
applying a second voltage to the another comb drive to induce rotational movement of the second portion of the another comb drive relative to the first portion of the another comb drive; and
applying a third voltage to at least one of the moveable plate and the fixed electrode to induce at least one of electrostatic attraction and electrostatic repulsion between the moveable electrode and the fixed electrode; and a magnitude of a capacitance between the moveable plate and the fixed electrode varies in dependence upon the induced movement of the moveable electrode relative to the fixed electrode.

8. The method according to claim 2, wherein
the anchor beam and the structure are disposed upon a side of the moveable plate;
the another beam and the another structure are disposed upon another side of the moveable plate distal to the side of the moveable plate; and
the further direction is perpendicular to the substrate.

9. The method according to claim 1, wherein
the support beam is a longitudinal beam disposed along an axis;
the moveable platform, the support beam and comb drive are disposed along the axis;
the set of interdigitated fingers are aligned along the axis; and
the anchor is perpendicular to the axis.

10. The method according to claim 1, wherein
the support beam is a longitudinal beam disposed along an axis;
the moveable platform, the support beam and comb drive are disposed along the axis;
the another support beam is another longitudinal beam disposed along the axis;
the moveable platform, the another support beam and another comb drive are disposed along the axis;
the set of interdigitated fingers and the another set of interdigitated fingers are aligned along the axis; and
the anchor and another anchor are each perpendicular to the axis.

11. The method according to claim 6, wherein
the anchor beam and the structure are disposed upon a side of the moveable plate;
the another beam and the another structure are disposed upon another side of the moveable plate distal to the side of the moveable plate; and
the further direction is perpendicular to the substrate.

12. The method according to claim 3, wherein
the support beam is a longitudinal beam disposed along an axis;
the moveable platform, the support beam and comb drive are disposed along the axis;
the set of interdigitated fingers are aligned along the axis; and
the anchor is perpendicular to the axis.

13. The method according to claim 3, wherein
the support beam is a longitudinal beam disposed along an axis;
the moveable platform, the support beam and comb drive are disposed along the axis;
the another support beam is another longitudinal beam disposed along the axis;
the moveable platform, the another support beam and another comb drive are disposed along the axis;
the set of interdigitated fingers and the another set of interdigitated fingers are aligned along the axis; and
the anchor and another anchor are each perpendicular to the axis.

\* \* \* \* \*